(12) United States Patent
Song et al.

(10) Patent No.: US 11,887,965 B2
(45) Date of Patent: Jan. 30, 2024

(54) SEMICONDUCTOR PACKAGE

(71) Applicant: SAMSUNG ELECTRONICS CO., LTD., Suwon-si (KR)

(72) Inventors: Eunseok Song, Hwaseong-si (KR); Kyung Suk Oh, Seongnam-si (KR)

(73) Assignee: Samsung Electronics Co., Ltd.

( * ) Notice: Subject to any disclaimer, the term of this patent is extended or adjusted under 35 U.S.C. 154(b) by 212 days.

(21) Appl. No.: 17/156,322

(22) Filed: Jan. 22, 2021

(65) Prior Publication Data

US 2021/0384161 A1    Dec. 9, 2021

(30) Foreign Application Priority Data

Jun. 9, 2020 (KR) .................. 10-2020-0069665

(51) Int. Cl.
| | |
|---|---|
| *H01L 25/065* | (2023.01) |
| *H01L 23/66* | (2006.01) |
| *H01L 23/31* | (2006.01) |
| *H01L 23/498* | (2006.01) |
| *H01L 23/00* | (2006.01) |

(52) U.S. Cl.
CPC ...... *H01L 25/0657* (2013.01); *H01L 23/3121* (2013.01); *H01L 23/49833* (2013.01); *H01L 23/66* (2013.01); *H01L 24/06* (2013.01); *H01L 2223/6677* (2013.01)

(58) Field of Classification Search
CPC ............. H01L 25/0657; H01L 23/3121; H01L 23/49833; H01L 23/66; H10N 80/00
See application file for complete search history.

(56) References Cited

U.S. PATENT DOCUMENTS

| | | | |
|---|---|---|---|
| 8,237,262 | B2 | 8/2012 | Pagaila et al. |
| 8,518,746 | B2 * | 8/2013 | Pagaila ............. H01L 23/49816 |
| | | | 438/618 |
| 9,390,974 | B2 | 7/2016 | Stuber et al. |
| 9,601,463 | B2 | 3/2017 | Yu et al. |
| 9,689,936 | B2 | 3/2017 | Zhai et al. |
| 10,547,119 | B2 | 1/2020 | Kim et al. |
| 2014/0028515 | A1 * | 1/2014 | Lu ........................... H01Q 1/36 |
| | | | 343/893 |

(Continued)

FOREIGN PATENT DOCUMENTS

KR          101132304         4/2012

*Primary Examiner* — Timor Karimy
(74) *Attorney, Agent, or Firm* — Fish & Richardson P.C.

(57) ABSTRACT

A semiconductor package includes a first redistribution substrate, a first semiconductor chip mounted on the first redistribution substrate, a second semiconductor chip disposed on a top surface of the first semiconductor chip, an insulating layer surrounding the first and second semiconductor chips on the first redistribution substrate, a second redistribution substrate disposed on the second semiconductor chip and on which the second semiconductor chip is mounted, and a connection terminal disposed at a side of the first and second semiconductor chips and connected to the first and second redistribution substrates. An inactive surface of the second semiconductor chip is in contact with an inactive surface of the first semiconductor chip. At an interface of the first and second semiconductor chips, an upper portion of the first semiconductor chip and a lower portion of the second semiconductor chip constitute one body formed of a same material.

16 Claims, 26 Drawing Sheets

(56) References Cited

U.S. PATENT DOCUMENTS

2017/0040266 A1    2/2017  Un et al.
2017/0084589 A1*  3/2017  Kuo .................... H01L 23/3128
2018/0358312 A1  12/2018  Yu et al.
2021/0375848 A1*  12/2021  Zhou ....................... H01L 24/08

* cited by examiner

SEMICONDUCTOR PACKAGE

CROSS-REFERENCE TO RELATED APPLICATION

This U.S. non-provisional patent application claims priority under 35 U.S.C. § 119 from, and the benefit of, Korean Patent Application No. 10-2020-0069665, filed on Jun. 9, 2020 in the Korean Intellectual Property Office, the contents of which are herein incorporated by reference in their entirety.

BACKGROUND

Embodiments of the inventive concepts are directed to a semiconductor package.

High-performance, high-speed and small electronic components are increasingly demanded by the electronics industry. To satisfy these demands, a packaging technique that provides a plurality of semiconductor chips in a single package has been suggested.

An integrated circuit chip may be realized in the form of a semiconductor package that can be appropriately applied to an electronic product. In a typical semiconductor package, a semiconductor chip is mounted on a printed circuit board (PCB) and is electrically connected to the PCB through bonding wires or bumps. In recent years, semiconductor packages have been variously developed to reduce their sizes, weights and/or manufacturing costs. In addition, various types of semiconductor packages have been suggested to be applied to large-capacity storage devices.

SUMMARY

Embodiments of the inventive concepts provide a miniaturized semiconductor package and a method of manufacturing the same.

Embodiments of the inventive concepts also provide a semiconductor package with improved structural stability and a method of manufacturing the same.

Embodiments of the inventive concepts also provide a semiconductor package with improved electrical characteristics and a method of manufacturing the same.

In an embodiment, a semiconductor package includes a first redistribution substrate, a first semiconductor chip mounted on the first redistribution substrate, a second semiconductor chip disposed on a top surface of the first semiconductor chip, an insulating layer surrounding the first and second semiconductor chips on the first redistribution substrate, a second redistribution substrate disposed on the second semiconductor chip and on which the second semiconductor chip is mounted, and a connection terminal disposed at a side of the first and second semiconductor chips and connected to the first and second redistribution substrates. An inactive surface of the second semiconductor chip is in contact with an inactive surface of the first semiconductor chip. At an interface of the first and second semiconductor chips, an upper portion of the first semiconductor chip and a lower portion of the second semiconductor chip constitute one body formed of a same material.

In an embodiment, a semiconductor package includes a first substrate, a first semiconductor chip mounted on the first substrate, a second semiconductor chip disposed on a top surface of the first semiconductor chip, an insulating layer that surrounds the first and second semiconductor chips on the first substrate, a second substrate disposed on the insulating layer and the second semiconductor chip and on which the second semiconductor chip is mounted, a connection terminal that penetrates the insulating layer at a side of the first and second semiconductor chips and is connected to the first and second substrates, and an antenna pattern disposed on a top surface of the second substrate and that is electrically connected to the second semiconductor chip. The second semiconductor chip is connected to the antenna pattern through the second substrate, and the first semiconductor chip is connected to the antenna pattern through the first substrate, the connection terminal and the second substrate.

In an embodiment, a semiconductor package includes a first substrate, a first semiconductor chip mounted on a top surface of the first substrate so that a first active surface of the first semiconductor chip faces the first substrate, a second substrate disposed on the first semiconductor chip, a second semiconductor chip mounted on a bottom surface of the second substrate so that a second active surface of the second semiconductor chip faces the second substrate, and an antenna pattern disposed on a top surface of the second substrate. At an interface of the first and second semiconductor chips, an upper portion of the first semiconductor chip and a lower portion of the second semiconductor chip constitute one body formed of the same material. The antenna pattern is disposed of a top surface of an insulating pattern of the second substrate and is connected to an interconnection pattern disposed in the insulating pattern.

In an embodiment, a method of manufacturing a semiconductor package includes providing a first wafer that includes device regions spaced apart from each other in one direction, and scribe regions between the device regions; forming first semiconductor chips in the device regions of the first wafer; forming a first bonding layer at a second surface of the first wafer by injecting an insulating material into the second surface of the first wafer wherein an upper portion of the first wafer is oxidized or nitrified by the surface treatment process, providing a second wafer that includes device regions spaced apart from each other in one direction, and scribe regions between the device regions forming second semiconductor chips in the device regions of the second wafer; forming a second bonding layer at a fourth surface of the second wafer by injecting an insulating material into the fourth surface of the second wafer wherein an upper portion of the second wafer is oxidized or nitrified by the surface treatment process; aligning the second wafer on the first wafer wherein the device regions of the first wafer overlap the device regions of the second wafer and the first bonding layer of the first wafer faces and is in contact with the second bonding layer of the second wafer; and bonding, the first and second bonding layers to each other by a hybrid bonding process performed by a surface activation process at an interface between the first and second bonding layers, wherein the surface activation process is performed on surfaces of the first and second bonding layers.

DETAILED DESCRIPTION OF EXEMPLARY EMBODIMENTS

Semiconductor packages according to exemplary embodiments of the inventive concepts will be described hereinafter with reference to the accompanying drawings.

Figure 1:
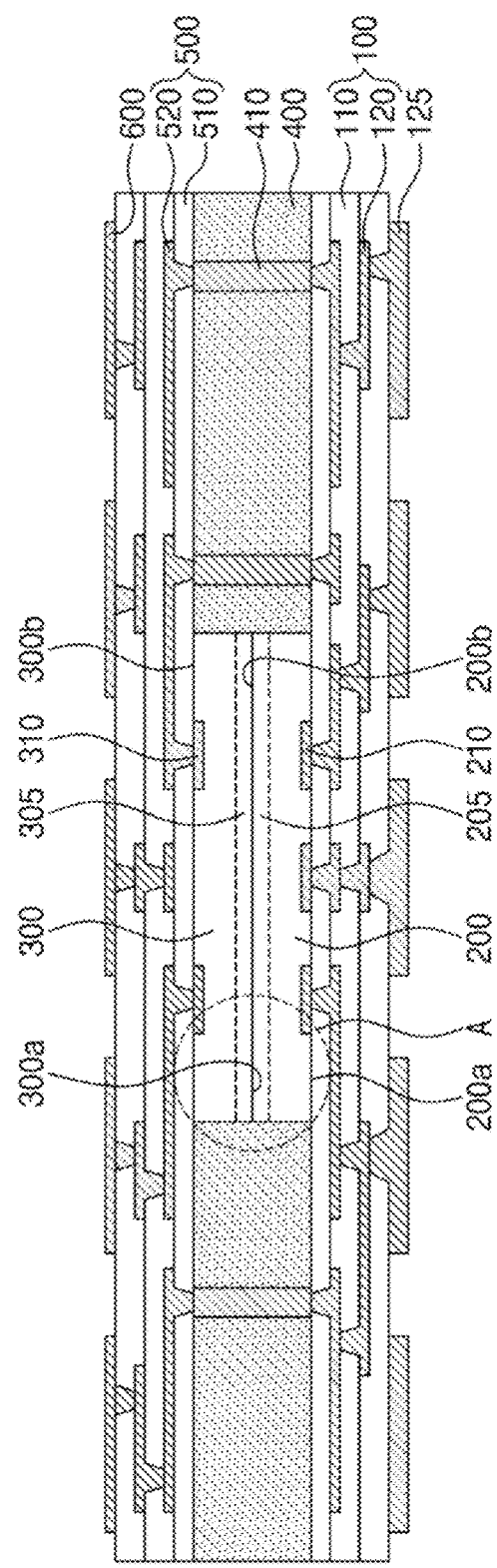
FIG. 1 is a cross-sectional view of a semiconductor package according to some embodiments of the inventive concepts.
Figure 2:
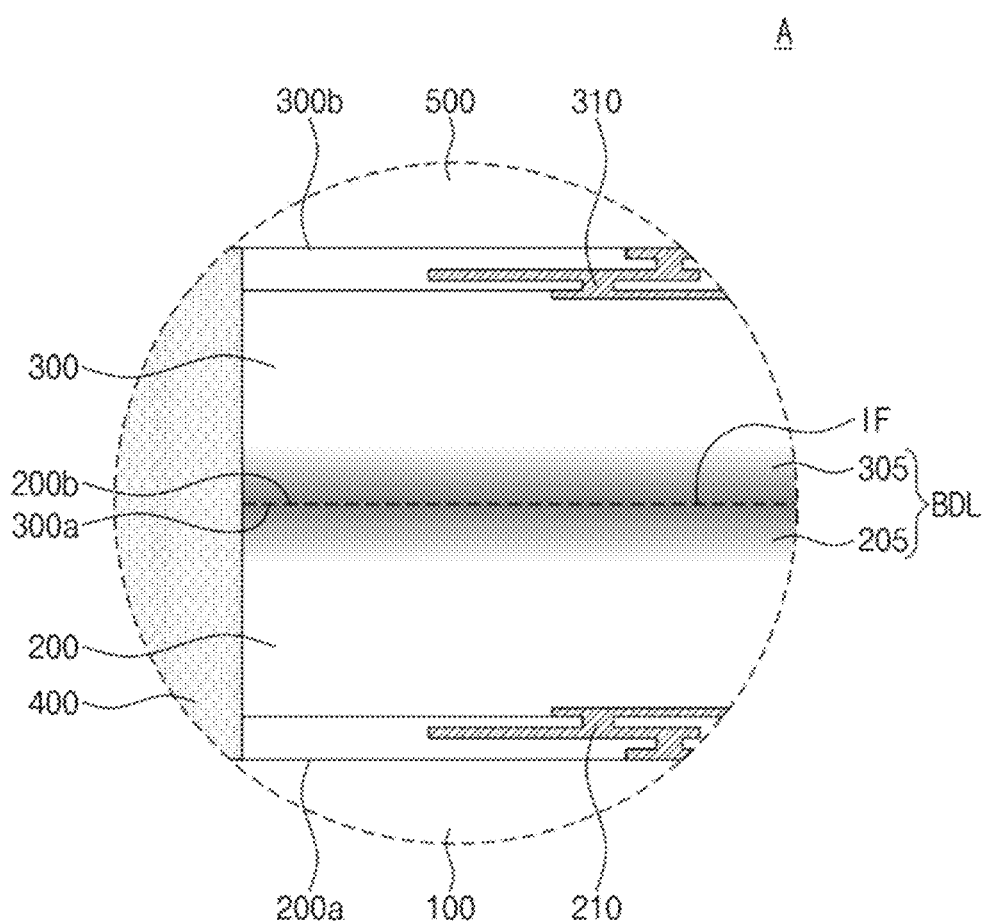
FIG. 2 is an enlarged view of a region 'A' of FIG. 1.

FIG. 1 is a cross-sectional view of a semiconductor package according to some embodiments of the inventive concepts. FIG. 2 is an enlarged view of a region 'A' of FIG. 1.

Referring to FIG. 1, according to an embodiment, a first substrate 100 is provided. The first substrate 100 is a redistribution substrate. For example, the first substrate 100 includes first insulating patterns 110 and first conductive patterns 120. Each of the first conductive patterns 120 includes a conductive layer between the first insulating patterns 110, and a via that penetrates the first insulating pattern 110. The first conductive patterns 120 are surrounded by the first insulating patterns 110. The first insulating patterns 110 include an inorganic insulating material such as silicon oxide ($SiO_x$) or silicon nitride ($SiN_x$). Alternatively, the first insulating patterns 110 include a polymer material. The first conductive patterns 120 include a metal. The first conductive patterns 120 redistribute a first semiconductor chip 200 mounted on the first substrate 100. A semiconductor package has a fan-out structure on the first substrate 100. The first conductive patterns 120 are connected to substrate pads 125 disposed on a bottom surface of the first substrate 100. External terminals are disposed on the substrate pads 125. In addition, a protective layer is disposed on the bottom surface of the first substrate 100. The protective layer covers the first insulating patterns 110 and the first conductive patterns 120 and exposes the substrate pads 125. The protective layer may include at least one of an insulating polymer, e.g., an epoxy-based polymer, an Ajinomoto build-up film (ABF), an organic material, or an inorganic material.

According to an embodiment, the first semiconductor chip 200 is disposed on the first substrate 100. The first semiconductor chip 200 has a planar shape that is smaller than that of the first substrate 100 when viewed in a plan view. In other words, the first semiconductor chip 200 is less wide than of the first substrate 100. The first semiconductor chip 200 is provided face-down. The first semiconductor chip 200 has a bottom surface 200a that faces the first substrate 100, and a to surface 200b opposite to the bottom surface 200a. The bottom surface 200a of the first semiconductor chip 200 is an active surface. The top surface 200b of the first semiconductor chip 200 is an inactive surface. The bottom surface 200a of the first semiconductor chip 200 is in contact with a top surface of the first substrate 100. The first semiconductor chip 200 includes first chip pads 210 disposed in a lower portion of the first semiconductor chip 200. The first chip pads 210 are electrically connected to the first conductive patterns 120 of the first substrate 100. The first semiconductor chip 200 includes a semiconductor material such as silicon (Si). The first semiconductor chip 200 may be a memory chip or an application processor (AP) chip. Alternatively, the first semiconductor chip 200 may include a power management integrated circuit (PMIC).

According to an embodiment, an upper portion 205 of the first semiconductor chip 200 contains an insulating material. More particularly, the upper portion 205 of the first semiconductor chip 200 is an insulating portion formed by doping a semiconductor material of the first semiconductor chip 200 with the insulating material. Hereinafter, the doped upper portion 205 of the first semiconductor chip 200 is referred to as a first bonding layer 205. A concentration of the insulating material in the first bonding layer 205 decreases with increasing distance from the top surface 200b of the first bonding layer 205, (i.e., the top surface 200b of the first semiconductor chip 200, toward the inside of the first semiconductor chip 200. The concentration of the insulating material in the first bonding layer 205 is greatest near the top surface 200b of the first bonding layer 205 and is least or zero at an interface or boundary with the first semiconductor chip 200. Thus, the first semiconductor chip 200 and the first bonding layer 205 of the first semiconductor chip 200 constitute a continuous component, and the interface between the first bonding layer 205 and the first semiconductor chip 200 as illustrated by a dotted line in FIG. 1 might not be visible. The insulating material may be nitrogen (N) or oxygen (O). In other words, the first bonding layer 205 may include an oxide, a nitride or an oxynitride of the material of the first semiconductor chip 200. For example, when the first semiconductor chip 200 is formed of silicon (Si), the first bonding layer 205 may include silicon oxide ($SiO_x$), silicon nitride ($SiN_x$), or silicon oxynitride (SiON).

According to an embodiment, a second semiconductor chip 300 is disposed on the first semiconductor chip 200. The second semiconductor chip 300 is in direct contact with the top surface 200b of the first semiconductor chip 200, i.e., the top surface of the first bonding layer 205. A width of the second semiconductor chip 300 is equal to the width of the first semiconductor chip 200. The second semiconductor chip 300 overlaps the first semiconductor chip 200. Here, sidewalls of the first semiconductor chip 200 are vertically aligned and coplanar with sidewalk of the second semiconductor chip 300. In other words, the second semiconductor chip 300 is vertically aligned with the first semiconductor chip 200. The second semiconductor chip 300 is provided face-up. In other words, the second semiconductor chip 300 has a bottom surface 300a that faces the first substrate 100, and a top surface 300b opposite to the bottom surface 300a. The bottom surface 300a of the second semiconductor chip 300 is an inactive surface. The top surface 300b of the second semiconductor chip 300 is an active surface. The bottom surface 300a of the second semiconductor chip 300 is in contact with the top surface 200b of the first semiconductor chip 200. The second semiconductor chip 300 includes second chip pads 310 disposed in an upper portion of the second semiconductor chip 300. The second semiconductor chip 300 is formed of the same material as the first semiconductor chip 200. For example, the second semiconductor chip 300 includes a semiconductor material such as silicon (Si). The second semiconductor chip 300 may be a memory chip or an application processor (AP) chip. Alternatively, the second semiconductor chip 300 may include a radio frequency integrated circuit (RF-IC). Still alternatively, the second semiconductor chip 300 may include a plurality of electronic devices. For example, the integrated circuit of the second semiconductor chip 300 includes the radio frequency integrated circuit (RF IC) and also at least one of various electronic devices that drive the RF IC, such as a power management integrated circuit (PMIC), a modem, a transceiver, a power amp module (PAM), a frequency filter, or a low noise amplifier (LNA).

According to an embodiment, a lower portion 305 of the second semiconductor chip 300 contains an insulating material. More particularly, the lower portion 305 of the second semiconductor chip 300 is an insulating portion formed by doping a semiconductor material of the second semiconductor chip 300 with the insulating material. Hereinafter, the doped lower portion 305 of the second semiconductor chip 300 is referred to as a second bonding layer 305. A concentration of the insulating material in the second bonding layer 305 decreases with increasing distance from a bottom surface 300a of the second bonding layer 305, i.e., the bottom surface 300a of the second semiconductor chip 300, toward the inside of the second semiconductor chip 300. The concentration of the insulating, material in the second bonding layer 305 is greatest near the bottom surface 300a of the second bonding layer 305 and is least or zero at an interface or boundary with the second semiconductor chip 300. Thus, the second semiconductor chip 300 and the second bonding layer 305 of the second semiconductor chip 300 constitute a continuous component, and the interface between the second bonding layer 305 and the second semiconductor chip 300 as illustrated by a dotted line in FIG. 1 might not be visible. The second bonding layer 305 includes the same material as the first bonding layer 205. The insulating material may be nitrogen (N) or oxygen (O). In other words, the second bonding layer 305 may include an oxide, a nitride or an oxynitride of the material of the second semiconductor chip 300. For example, when the second semiconductor chip 300 is formed of silicon (Si), the second bonding layer 305 may include silicon oxide ($SiO_x$), silicon nitride ($SiN_x$), or silicon oxynitride (SiON).

As illustrated in FIG. 2, according to an embodiment, the second semiconductor chip 300 and the first semiconductor chip 200 are bonded directly to each other. For example, the top surface 200b, i.e., the inactive surface, of the first semiconductor chip 200 is in contact with the bottom surface 300a, i.e., the inactive surface, of the second semiconductor chip 300. In other words, the top surface 200b of the first bonding layer 205 of the first semiconductor chip 200 is in contact with the bottom surface 300a of the second bonding layer 305 of the second semiconductor chip 300 at an interface IF between the first semiconductor chip 200 and the second semiconductor chip 300. The first bonding layer 205 is hybrid-bonded to the second bonding layer 305. In an embodiment, hybrid bonding means that two components that include the same kind of a material are fused together at their interface. For example, the first bonding layer 205 and the second bonding layer 305 constitute a continuous component, and the interface IF between the first and second bonding layers 205 and 305 might not be visible. For example, the first and second bonding layers 205 and 305 are formed of the same material, and thus the interface IF between the first and second bonding layers 205 and 305 might not exist. In other words, the first and second bonding layers 205 and 305 constitute a single component. Hereinafter, the first and second bonding layers 205 and 305 are referred to as a single bonding layer BDL. Thus, the first semiconductor chip 200 and the second semiconductor chip 300 constitute a continuous component and can be distinguished from each other by the bonding layer BDL formed therebetween. Since the first and second bonding layers 205 and 305 are formed as one body, the first semiconductor chip 200 can be firmly bonded to the second semiconductor chip 300 and structural stability of the semiconductor package can be improved. In addition, the first and second semiconductor chips 200 and 300 can be bonded to each other by using the bonding layer BDL, which is formed of silicon oxide or silicon nitride and is highly thermally conductive, and thus heat generated from the first semiconductor chip 200 can be easily released or dissipated through the second semiconductor chip 300. Furthermore, the first and second semiconductor chips 200 and 300 can be bonded to each other without an additional bonding member between the first and second semiconductor chips 200 and 300, and thus a height of the semiconductor package can be reduced and the semiconductor package can be miniaturized. A distance from the bottom surface 200a of the first semiconductor chip 200 to the top surface 300b of the second semiconductor chip 300 ranges from 30 μm to 50 μm. The concentration of the insulating material decreases from the interface IF between the first and second bonding layers 205 and 305 toward the insides of the first and second semiconductor chips 200 and 300. The first semiconductor chip 200 and the second semiconductor chip 300 are electrically insulated from each other by the bonding layer BDL.

Referring again to FIG. 1, according to an embodiment, an insulating layer 400 is disposed on the first substrate 100. The insulating layer 400 covers the top surface of the first substrate 100. The insulating layer 400 surrounds the first semiconductor chip 200 and the second semiconductor chip 300. A top surface of the insulating layer 400 is located at the same level as the top surface 300b of the second semiconductor chip 300. In other words, the top surface 300b of the second semiconductor chip 300 is exposed at the top surface of the insulating layer 400. The insulating layer 400 includes an insulating material. For example, the insulating layer 400 includes an epoxy molding compound (EMC).

According to an embodiment, a second substrate 500 is disposed on the insulating layer 400. The second substrate 500 covers the top surface of the insulating layer 400 and the top surface 300b of the second semiconductor chip 300. The second substrate 500 is a redistribution substrate. For example, the second substrate 500 includes second insulating patterns 510 and second conductive patterns 520. Each of the second conductive patterns 520 includes a conductive layer between the second insulating patterns 510, and a via that penetrates the second insulating pattern 510. The second conductive patterns 520 are surrounded by the second insulating patterns 510. The second insulating patterns 510 include an inorganic insulating material such as silicon oxide ($SiO_x$) or silicon nitride ($SiN_x$). Alternatively, the second insulating patterns 510 include a polymer material. The second conductive patterns 520 include a metal. The second conductive patterns 520 redistribute the second semiconductor chip 300. For example, the second semiconductor chip 300 is mounted on a bottom surface of the second substrate 500. The second chip pads 310 are electrically connected, to the second conductive patterns 520 of the second substrate 500. The second semiconductor chip 300 has a fan-out structure by the second substrate 500.

According to an embodiment, connection terminals 410 are disposed between the first substrate 100 and the second substrate 500. The connection terminals 410 are horizontally spaced apart from the first and second semiconductor chips 200 and 300. The connection terminals 410 penetrate the insulating layer 400 and connect the first conductive patterns 120 of the first substrate 100 to the second conductive patterns 520 of the second substrate 500. For example, each of the connection terminals 410 is a through-electrode that vertically penetrates the insulating layer 400.

According to an embodiment, an antenna pattern 600 is disposed on the second substrate 500. The antenna pattern 600 is a planar antenna array that includes a plurality of patch patterns disposed on a top surface of the second substrate 500. The patch patterns are disposed throughout the top surface of the second substrate 500. Each of the patch patterns of the antenna pattern 600 is a patch antenna. For example, the patch patterns are arranged on the top surface of the second substrate 500 to generate broadside radiation. The antenna pattern 600 is connected to the second semiconductor chip 300 through the second substrate 500 and is connected to the first semiconductor chip 200 through the second substrate 500, the connection terminal 410 and the first substrate 100. The antenna pattern 600 receives an electrical signal from the first and second semiconductor chips 200 and 300 and radiates an antenna signal in an upward direction and a lateral direction of the second substrate 500. Depending on a structure and a position of the antenna pattern 600, the antenna signal of the semiconductor package may be omnidirectional. For example, the antenna pattern 600 can be arranged throughout the top surface of the second substrate 500, and thus have a wide radiation area and a wide radiation angle. The antenna pattern 600 may include, but is not limited to, a conductive material such as copper (Cu), aluminum (Al), silver (Ag), tin (Sn), gold (Au), nickel (Ni) lead (Pb), titanium (Ti), or any alloy thereof. The antenna pattern 600 may be omitted.

According to an embodiment, since the second semiconductor chip 300 is connected to the antenna pattern 600 through the second substrate 500, an electrical connection length between the second semiconductor chip 300 and the antenna pattern 600 is short. In addition, since the first semiconductor chip 200 is connected to the antenna pattern 600 through the first substrate 100, the connection terminals 410 and the second substrate 500 in the single semiconductor package, an electrical connection length between the first semiconductor chip 200 and the antenna pattern 600 is also hort. In more detail, the first semiconductor chip 200, the second semiconductor chip 300 and the antenna pattern 600 are not formed in different packages, but both the first and second semiconductor chips 200 and 300 that control the antenna pattern 600 can be provided in the single semiconductor package that has the antenna pattern 600. Thus, a miniaturized semiconductor package with improved electrical characteristics can be provided or realized.

Figure 3:
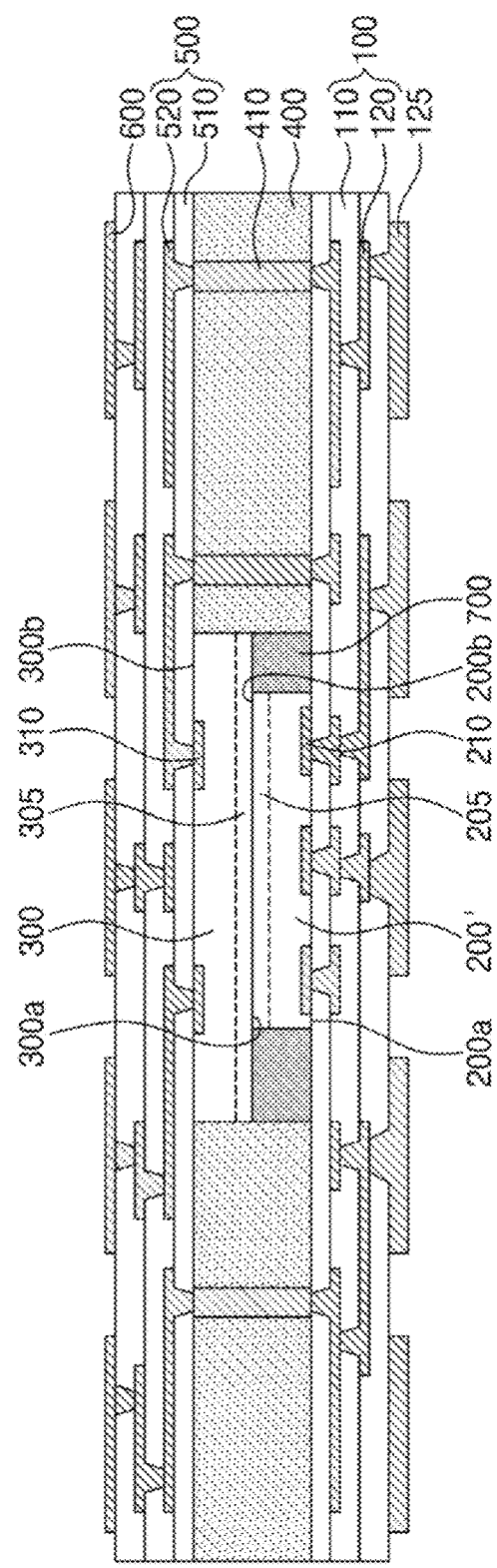
FIGS. 3 and 4 are cross-sectional views of semiconductor packages according to some embodiments of the inventive concepts.
Figure 4:
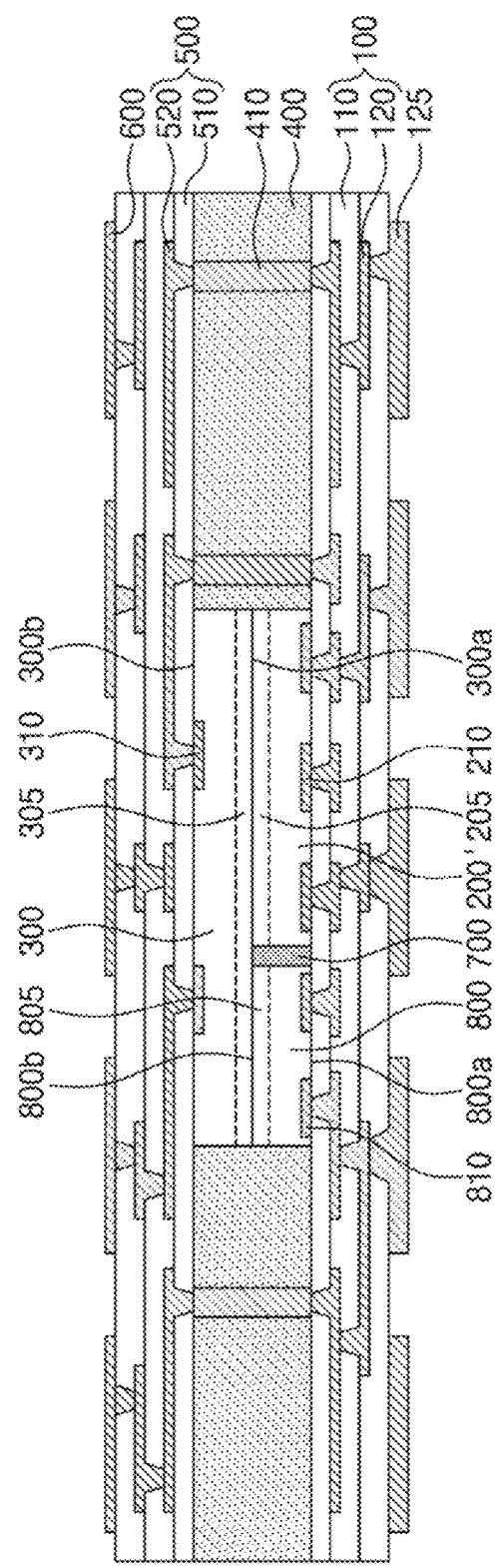

FIGS. 3 and 4 are cross-sectional views that illustrate semiconductor packages according to some embodiments of the inventive concepts. For the purpose of ease and convenience in explanation, the same components as in the above embodiments will be indicated by the same reference numerals or designators and the descriptions thereto will be omitted.

Referring to FIG. 3, according to an embodiment, a second semiconductor chip 300 is disposed on a first semiconductor chip 200'. The second semiconductor chip 300 is bonded directly to a top surface 200b of the first semiconductor chip 200', i.e., a top surface 200b of a first bonding layer 205 of the first semiconductor chip 200'. The bonding of the first semiconductor chip 200' and the second semiconductor chip 300 is the same as described with reference to FIG. 2. In other words, the upper portion 205 of the first semiconductor chip 200' and the lower portion 305 of the second semiconductor chip 300 are bonded to each other by hybrid bonding. The first semiconductor chip 200' has a planar shape that is smaller than that of the second semiconductor chip 300 when viewed in a plan view. In other words, the first semiconductor chip 200' is less wide than the second semiconductor chip 300. The second semiconductor chip 300 vertically overlaps the first semiconductor chip 200'. For example, the first semiconductor chip 200 is located inside the second semiconductor chip 300 when viewed in a plan view. Thus, a portion of the bottom surface 300a of the second semiconductor chip 300 is exposed.

According to an embodiment, a molding structure 700 is disposed on the first substrate 100. The molding structure 700 is disposed at a side of the first semiconductor chip 200' and fills a space between the first substrate 100 and the second semiconductor chip 300. The molding structure 700 surrounds the first semiconductor chip 200' when viewed in a plan view. Sidewalls of the molding structure 700 are vertically aligned and coplanar with sidewalls of the second semiconductor chip 300. In other words, the second semiconductor chip 300 is vertically aligned with the first semiconductor chip 200' and the molding structure 700. The molding structure 700 fills a space surrounded by the first substrate 100, the first semiconductor chip 200', the second semiconductor chip 300 and the insulating layer 400, in FIG. 3, the first semiconductor chip 200' is disposed under a central portion of the second semiconductor chip 300. However, embodiments of the inventive concepts are not limited thereto.

Unlike FIG. 3, according to an embodiment, the first semiconductor chip 200' may be disposed in such a way that one of sidewalk of the first semiconductor chip 200' is aligned with one of the sidewalls of the second semiconductor chip 300. A space between the first substrate 100 and the second semiconductor chip 300 at a side of the first semiconductor chip 200' is filled with the molding structure 700.

In certain embodiments, as illustrated in FIG. 4, a third semiconductor chip 800 is disposed between die first substrate 100 and the second semiconductor chip 300 at a side of the first semiconductor chip 200' The third semiconductor chip 800 is spaced apart from the first semiconductor chip 200'. The third semiconductor chip 800 has a planar shape that is smaller than that of the second semiconductor chip 300 when viewed in a plan view. In other words, the third semiconductor chip 800 is less wide than the second semiconductor chip 300. The first semiconductor chip 200' and the third semiconductor chip 800 vertically overlap with the second semiconductor chip 300. Here, one of sidewalls of the third semiconductor chip 800 is vertically aligned and coplanar with one of the sidewalls of the second semiconductor chip 300, and one of the sidewalls of the first semiconductor chip 200' is vertically aligned and coplanar with another of the sidewalls of the second semiconductor chip 300. The third semiconductor chip 800 is provided face-down. In other words, the third semiconductor chip 800 has a bottom surface 800a that faces the first substrate 100, and a top surface 800b opposite to the bottom surface 800a. The bottom surface 800a of the third semiconductor chip 800 is an active surface. The top surface 800b of the third semiconductor chip 800 is an inactive surface. The bottom surface 800a of the third semiconductor chip 800 is in contact with the top surface of the first substrate 100. Third chip pads 810 of the third semiconductor chip 800 are electrically connected to the first conductive patterns 120 of the first substrate 100. The third semiconductor chip 800 includes a semiconductor material such as silicon (Si). The third semiconductor chip 800 may be a memory chip or an application processor (AP) chip. Alternatively, the third semiconductor chip 800 may include a dummy chip.

According to an embodiment, an upper portion 805 of the third semiconductor chip 800 contains an insulating material. More particularly, the upper portion 805 of the third semiconductor chip 800 is an insulating portion formed by doping the semiconductor material of the third semiconductor chip 800 with the insulating material. A concentration of the insulating material in the upper portion 805 of the third semiconductor chip 800 decreases with increasing from the top surface 800b of the third semiconductor chip 800 toward the inside of the third semiconductor chip 800. The insulating material may be nitrogen (N) or oxygen (O). In other words, the upper portion 805 of the third semiconductor chip 800 may include an oxide, a nitride or an oxynitride of the material of the third semiconductor chip 800.

According to an embodiment, the second semiconductor chip 300 and the third semiconductor chip 800 are in direct contact with each other. For example, the top surface 800b, i.e., the inactive surface, of the third semiconductor chip 800 is in contact with the bottom surface 300a, i.e., the inactive surface, of the second semiconductor chip 300. The upper portion 805 of the third semiconductor chip 800 and the lower portion 305 of the second semiconductor chip 300 are bonded to each other by hybrid bonding. An interface between the upper portion 805 of the third semiconductor chip 800 and the lower portion 305 of the second semiconductor chip 300 might not be visible. The upper portion 805 of the third semiconductor chip 800 and the lower portion 305 of the second semiconductor chip 300 are provided in one body. Thus, the third and second semiconductor chips 800 and 300 constitute a continuous component. In addition, the third and second semiconductor chips 800 and 300 are firmly bonded to each other.

According to an embodiment, a molding structure 700 fills a space between the first semiconductor chip 200' and the third semiconductor chip 800.

Figure 5:
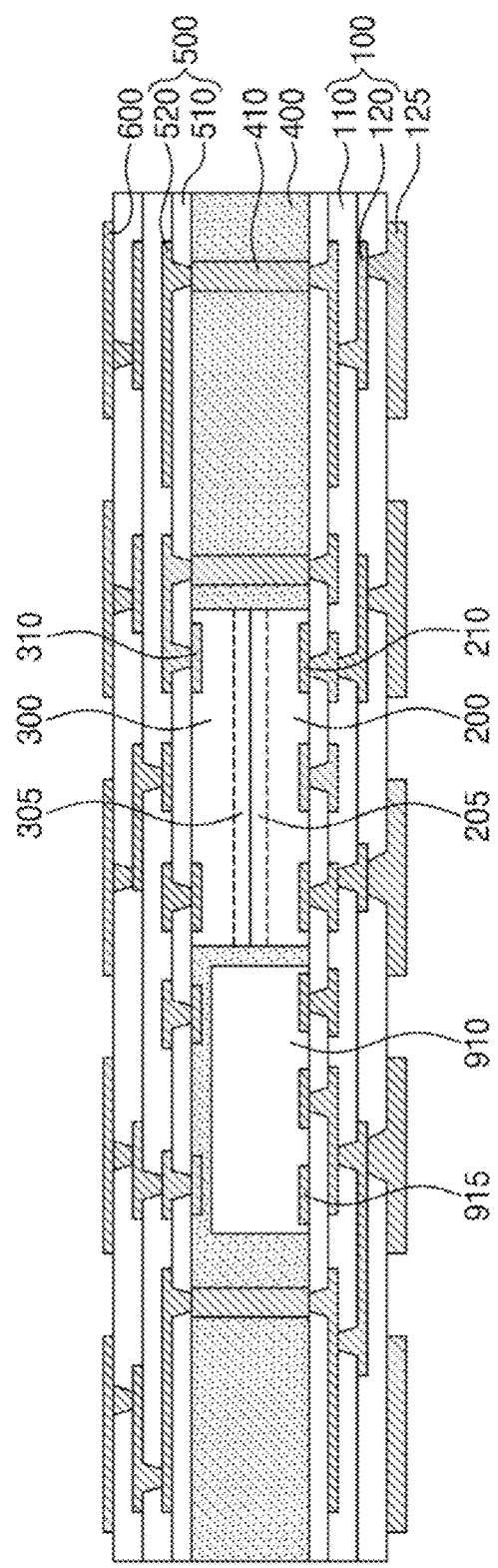
FIGS. 5 and 6 are cross-sectional views of semiconductor packages according to some embodiments of the inventive concepts.
Figure 6:
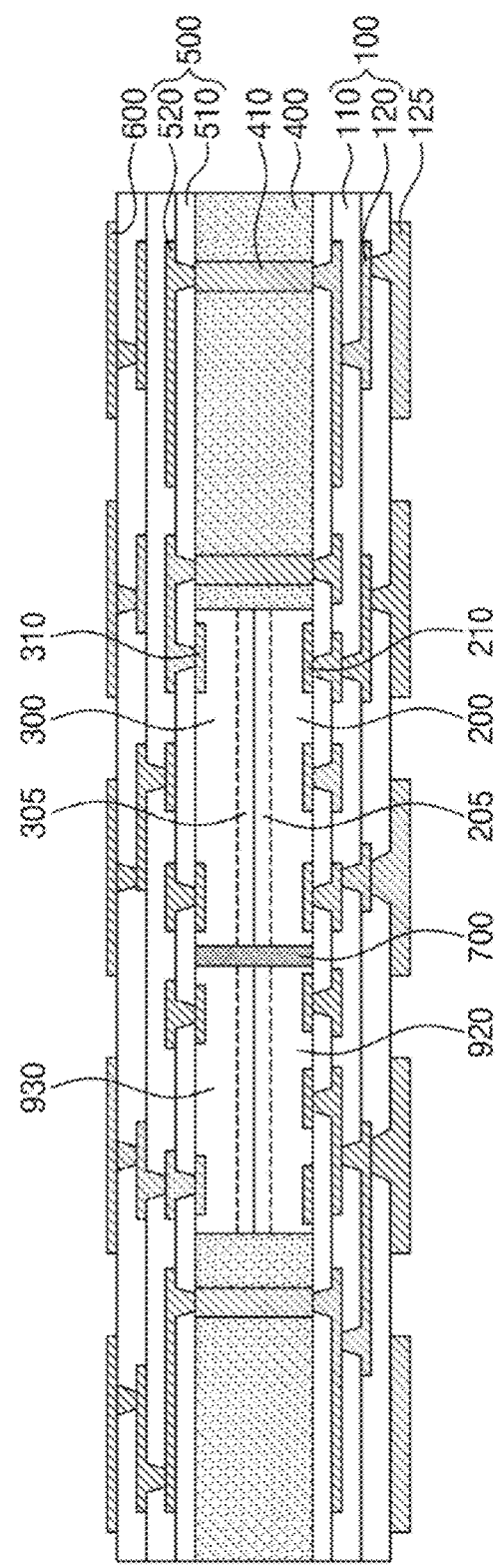

FIGS. 5 and 6 are cross-sectional views that illustrate semiconductor packages according to some embodiments of the inventive concepts.

Referring to FIG. 5, according to an embodiment, a first semiconductor chip 200, a second semiconductor chip 300 and a fourth semiconductor chip 910 are be disposed on a first substrate 100. Here, the first semiconductor chip 200 and the second semiconductor chip 300 are the same as or similar to those described with reference to FIG. 1. For example, the second semiconductor chip 300 is bonded onto the first semiconductor chip 200, and a width of the first semiconductor chip 200 is equal to a width of the second semiconductor chip 300.

According to an embodiment, the fourth semiconductor chip 910 is horizontally spaced apart from the first and second semiconductor chips 200 and 300. A top surface of the fourth semiconductor chip 910 may be located at a lower level than a top surface of the second semiconductor chip 300. Alternatively, the top surface of the fourth semiconductor chip 910 is located at the same level as the top surface of the second semiconductor chip 300. The fourth semiconductor chip 910 is provided face-down. In other words, an active surface of the fourth semiconductor chip 910 is in contact with the top surface of the first substrate 100. Chip pads 915 of the fourth semiconductor chip 910 are disposed in a lower portion of the fourth semiconductor chip 910 and are electrically connected to first conductive patterns 120 of the first substrate 100. The fourth semiconductor chip 910 may include a logic chip or a memory chip.

According to an embodiment, an insulating layer 400 surrounds the first, second semiconductor and fourth chips 200, 300 and 910 and covers the top surface of the fourth semiconductor chip 910. When the top surface of the fourth semiconductor chip 910 is located at the same level as the top surface of the second semiconductor chip 300, the insulating layer 400 surrounds the fourth semiconductor chip 910 and exposes the top surface of the fourth semiconductor chip 910.

In certain embodiments, a plurality of semiconductor chips are provided at a side of the first and second semiconductor chips 200 and 300. As illustrated in FIG. 6, the first semiconductor chip 200, the second semiconductor chip 300, a fifth semiconductor chip 920 and a sixth semiconductor chip 930 are disposed on the first substrate 100. Here, the first semiconductor chip 200 and the second semiconductor chip 300 are the same as or are similar to those described with reference to FIG. 1. For example, the second semiconductor chip 300 is bonded onto the first semiconductor chip 200, and a width of the first semiconductor chip 200 is equal to a width of the second semiconductor chip 300.

According to an embodiment, the fifth semiconductor chip 920 is horizontally spaced apart from the first and second semiconductor chips 200 and 300. A top surface of the fifth semiconductor chip 920 is located at a lower level than the top surface of the second semiconductor chip 300. The fifth semiconductor chip 920 is provided face-down. In other words, an active surface of the fifth semiconductor chip 920 is in contact with the top surface of the first substrate 100. Chip pads of the fifth semiconductor chip 920 are disposed in a lower portion of the fifth semiconductor chip 920 and are electrically connected to the first conductive patterns 120 of the first substrate 100. The fifth semiconductor chip 920 may be a memory chip or an application processor (AP) chip.

According to an embodiment, an upper portion of the fifth semiconductor chip 920 contains an insulating material. More particularly, the upper portion of the fifth semiconductor chip 920 is an insulating portion formed by doping a semiconductor material of the fifth semiconductor chip 920 with the insulating material. A concentration of the insulating material in the upper portion of the fifth semiconductor chip 920 decreases with increasing distance from a top surface of the fifth semiconductor chip 920 toward the inside of the fifth semiconductor chip 920. The insulating material may be nitrogen (N) or oxygen (O).

According to an embodiment, the sixth semiconductor chip 930 is disposed on the fifth semiconductor chip 920. A bottom surface of the sixth semiconductor chip 930 is in contact with the top surface of the fifth semiconductor chip 920. A width of the sixth semiconductor chip 930 is equal to a width of the fifth semiconductor chip 920. Here, sidewalls of the fifth semiconductor chip 920 are coplanar with sidewalk of the sixth semiconductor chip 930. In Other words, the fifth semiconductor chip 920 is vertically aligned with the sixth semiconductor chip 930. A top surface of the sixth semiconductor chip 930 is located at the same level as the top surface of the second semiconductor chip 300. The sixth semiconductor chip 930 is provided face-up. In other words, an active surface of the sixth semiconductor chip 930 is provided at a surface of the sixth semiconductor chip 930 that is opposite to the first substrate 100. The active surface of the sixth semiconductor chip 930 is in contact, with the bottom surface of the second substrate 500. Chip pads of the sixth semiconductor chip 930 are disposed in an upper portion of the sixth semiconductor chip 930 and are electrically connected to the second conductive patterns 520 of the second substrate 500. The sixth semiconductor chip 930 may include a radio frequency integrated circuit (RF-IC).

According to an embodiment, a lower portion of the sixth semiconductor chip 930 contains an insulating material. More particularly, the lower portion of the sixth semiconductor chip 930 is an insulating portion formed by doping a semiconductor material of the sixth semiconductor chip 930 with the insulating material. A concentration of the insulating material in the lower portion of the sixth semiconductor chip 930 decreases with increasing distance from a bottom surface of the sixth semiconductor chip 930 toward the inside of the sixth semiconductor chip 930. The insulating material may be nitrogen (N) or oxygen (O).

According to an embodiment, the fifth semiconductor chip 920 is in direct contact with the sixth semiconductor chip 930. For example, a top surface, i.e., an inactive surface, of the fifth semiconductor chip 920 is in contact with a bottom surface, i.e., an inactive surface, of the sixth semiconductor chip 930. The upper portion of the fifth semiconductor chip 920 and the lower portion of the sixth semiconductor chip 930 are bonded to each other by hybrid bonding. An interface between the upper portion of the fifth semiconductor chip 920 and the lower portion of the sixth semiconductor chip 930 might not be visible. The upper portion of the fifth semiconductor chip 920 and the lower portion of the sixth semiconductor chip 930 constitute a single component. Thus, the fifth and sixth semiconductor chips 920 and 930 constitute a continuous component. In addition, the fifth and sixth semiconductor chips 920 and 930 are firmly bonded to each other.

According to an embodiment, a molding structure 700 fills a space between the first and second semiconductor chips 200 and 300 and the fifth and sixth semiconductor chips 920 and 930.

According to an embodiment, the insulating layer 400 surrounds the first semiconductor chip 200, the second semiconductor chip 300, the fifth semiconductor chip 920, and the sixth semiconductor chip 930. A top surface of the insulating layer 400 is located at the same level as the top surface of the second semiconductor chip 300 and the top surface of the sixth semiconductor chip 930.

Figure 7:
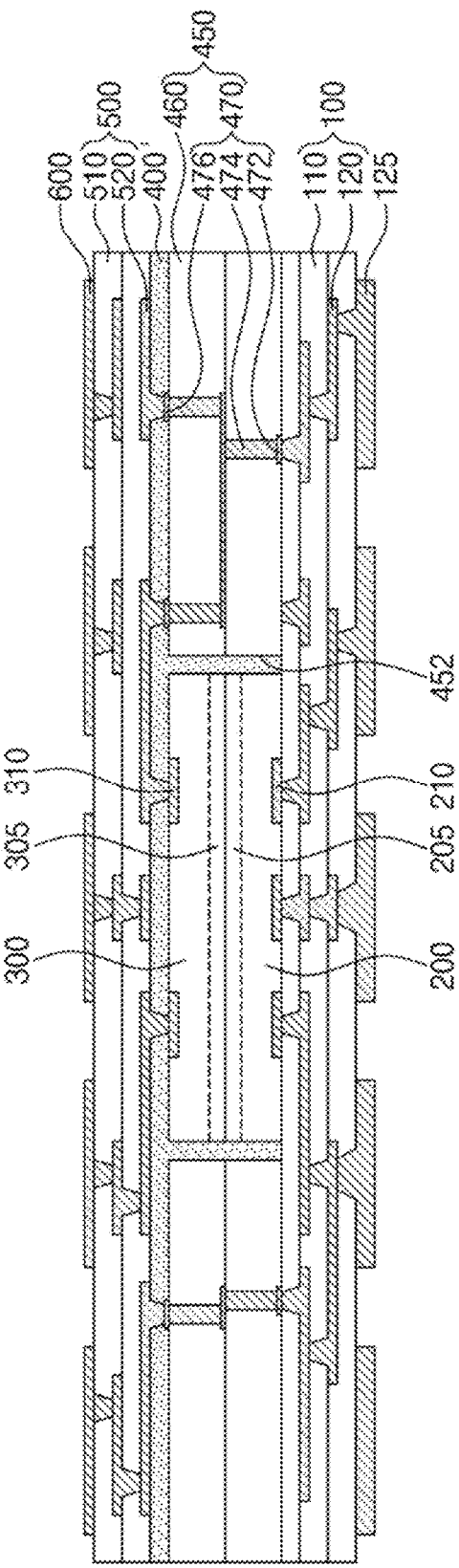
FIG. 7 is a cross-sectional view of a semiconductor package according to some embodiments of the inventive concepts.

FIG. 7 is a cross-sectional view that illustrates a semiconductor package according to some embodiments of the inventive concepts.

Referring to FIG. 7, according to an embodiment, a connection substrate 450 is disposed on the first substrate 100. The connection substrate 450 has an opening 452 that penetrates the connection substrate 450. For example, the opening 452 is an open hole that connects a top surface and a bottom surface of the connection substrate 450. The bottom surface of the connection substrate 450 is in contact with the top surface of the first substrate 100. The connection substrate 450 includes a base layer 460 and a conductive portion 470 in the base layer 460 that corresponds to an interconnection pattern. For example, the base layer 460 includes silicon oxide. The conductive portion 470 is disposed outside of the opening 452 in the connection substrate 450. The conductive portion 470 includes lower pads 472, vias 474, and upper pads 476. The lower pads 472 are disposed in a lower portion of the connection substrate 450. The lower pads 472 are electrically connected to the first conductive patterns 120 of the first substrate 100. The upper pads 476 are disposed in an upper portion of the connection substrate 450. The upper pads 476 are electrically connected to the second conductive patterns 520 of the second substrate 500. The vias 474 penetrate the base layer 460 and electrically connect the lower pads 472 to the upper pads 476.

According to an embodiment, a first semiconductor chip 200 and a second semiconductor chip 300 are disposed on the first substrate 100. The first semiconductor chip 200 and the second semiconductor chip 300 are disposed in the opening 452 of the connection substrate 450. Here, the first semiconductor chip 200 and the second semiconductor chip 300 are the same as or similar to those described with reference to FIG. 1. For example, the second semiconductor chip 300 is bonded onto the first semi conductor chip 200, and a width of the first semiconductor chip 200 is equal to a width of the second semiconductor chip 300. The first and second semiconductor chips 200 and 300 have planar shapes that are smaller than that of the opening 452 when viewed in a plan view. In other words, the first and second semiconductor chips 200 and 300 are spaced apart from an inner sidewall of the opening 452.

According to an embodiment, an insulating layer 400' is disposed on the first substrate 100. The insulating layer 400' fills a space between the connection substrate 450 and the first semiconductor chip 200 and between the connection substrate 450 and the second semiconductor chip 300. A bottom most surface of the insulating layer 400' is in contact with the top surface of the first substrate 100. Here, the bottom most surface of the insulating layer 400' is located at the same level as the bottom surface of the connection substrate 450 and the bottom surface of the first semiconductor chip 200. The insulating layer 400' covers the top surface of the connection substrate 450 and the top surface of the second semiconductor chip 300.

According to an embodiment, the second substrate 500 is disposed on the insulating layer 400'. The second substrate 500 covers a top surface of the insulating layer 400'. The second substrate 500 is a redistribution substrate. For example, the second substrate 500 includes the second insulating patterns 510 and the second conductive patterns 520. Each of the second conductive patterns 520 includes a conductive layer between the second insulating patterns 510, and a via that penetrates the second insulating pattern 510. The second conductive patterns 520 penetrate the second insulating patterns 510 and the insulating layer 400' to be connected to the upper pads 476 of the connection substrate 450 and the second chip pads 310 of the second semiconductor chip 300.

FIGS. 8 to 16 are cross-sectional views that illustrate a method of manufacturing a semiconductor package according to some embodiments of the inventive concepts.

Figure 8:
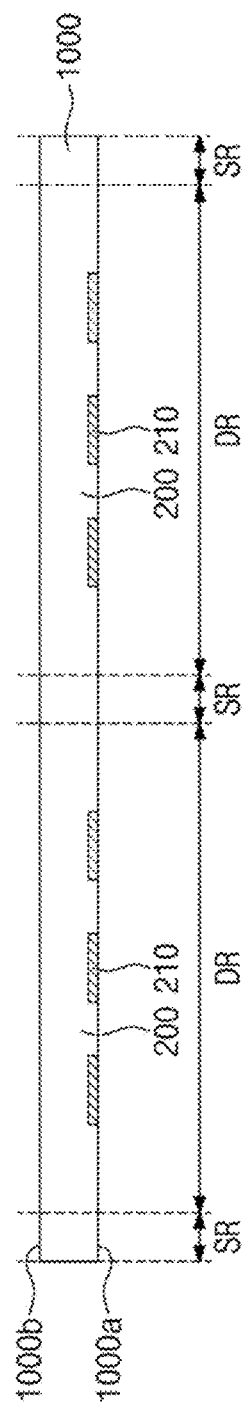
FIG. 8 to 16 are cross-sectional views that illustrate a method of manufacturing a semiconductor package according to some embodiments of the inventive concepts.

Referring to FIG. 8, according to an embodiment, a first wafer 1000 is provided. The first wafer 1000 is a semiconductor wafer. For example, the first wafer 1000 may be a silicon (Si) substrate, a germanium (Ge) substrate, or a silicon-germanium (SiGe) substrate. The first wafer 1000 includes a first surface 1000a and a second surface 1000b which are opposite to each other. The first wafer 1000 includes device regions DR spaced apart from each other in one direction, and scribe regions SR between the device regions DR. The device regions DR of the first wafer 1000 are where first semiconductor chips 200 are formed. The scribe regions SR of the first wafer 1000 are where a subsequent sawing process that separates the first semiconductor chips 200 will be performed.

According to an embodiment, the first semiconductor chips 200 are formed in the device regions DR of the first wafer 1000. The first semiconductor chips 200 are formed in the first surface 1000a of the first wafer 1000, integrated circuits of the first semiconductor chips 200 are formed at the first stir face 1000a of the first wafer 1000, and first chip pads 210 of the first semiconductor chips 200 are formed at the first surface 1000a of the first wafer 1000.

Figure 9:
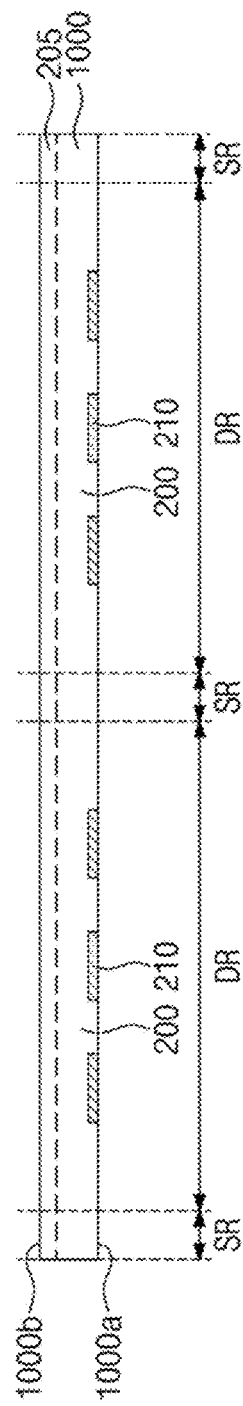

Referring to FIG. 9, according to an embodiment, a first bonding layer 205 is formed at the second surface 1000b of the first wafer 1000. For example, a surface treatment process is performed on the second surface 1000b of the first wafer 1000. The surface treatment process includes a process of injecting an insulating material into the second surface 1000b the first wafer 1000. The insulating material may include oxygen (O) or nitrogen (N). In other words, the surface treatment process is an oxidation process or a nitrification process. The insulating material is injected into the second surface 1000b of the first wafer 1000 by the surface treatment process. At this time, a concentration of the insulating material in the first wafer 1000 decreases with an increasing distance from the second surface 1000b of the first wafer 1000. An upper portion of the first wafer 1000 is oxidized or nitrified by the surface treatment process, and thus the first bonding layer 205 can be formed.

Figure 10:
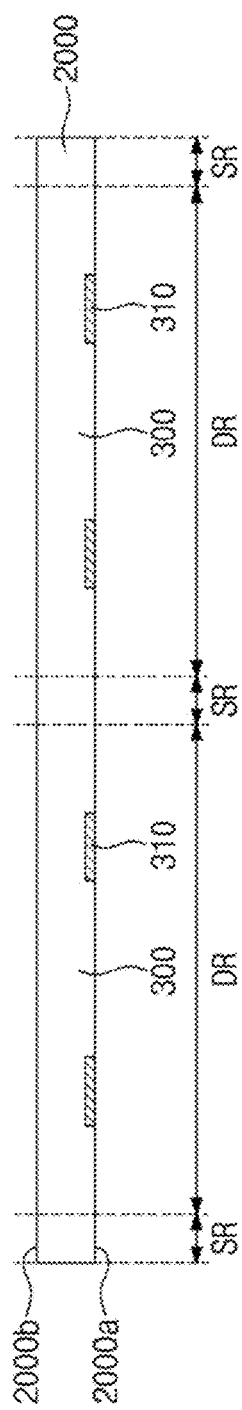

Referring to FIG. 10, according to an embodiment, a second wafer 2000 is provided. The second wafer 2000 is a semiconductor wafer. The second wafer 2000 includes the same material as the first wafer 1000. For example, the second wafer 2000 may be a silicon (Si) substrate, a germanium (Ge) substrate, or a silicon-germanium (SiGe) substrate. The second wafer 2000 includes a third surface 2000a and a fourth surface 2000b which are opposite to each other. The second wafer 2000 includes device regions DR spaced apart from each other in one direction, and scribe regions SR between the device regions DR. The device regions DR of the second wafer 2000 are where second semiconductor chips 300 are formed. The scribe regions SR of the second wafer 2000 are where a subsequent sawing process that separates the second semiconductor chips 300 will be performed.

According to an embodiment, the second semiconductor chips 300 are formed in the device regions DR of the second wafer 2000. The second semiconductor chips 300 are formed in the third surface 2000a of the second wafer 2000. Integrated circuits of the second semiconductor chips 300 are formed at the third surface 2000a of the second wafer 2000, and second chip pads 310 of the second semiconductor chips 300 are formed at the third surface 2000a of the second wafer 2000.

Figure 11:
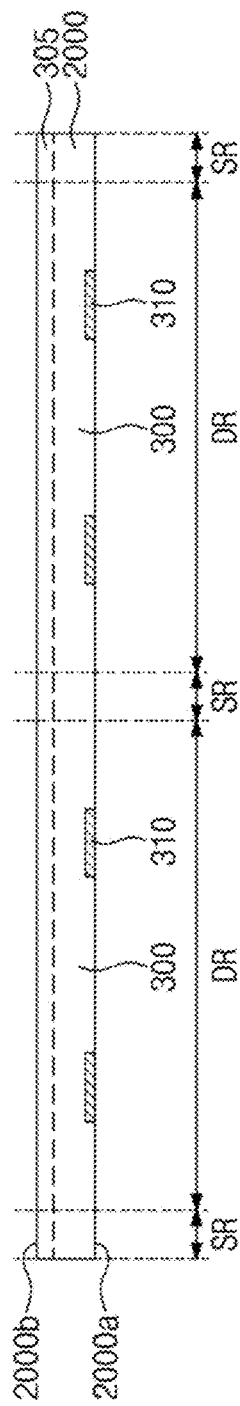

Referring to FIG. 11, according to a embodiment, a second bonding layer 305 is formed at the fourth surface 2000b of the second wafer 2000. For example, a surface treatment process is performed on the fourth surface 2000b of the second wafer 2000. The surface treatment process includes a process of injecting an insulating material into the fourth surface 2000b of the second wafer 2000. The insulating material may include oxygen (O) or nitrogen (N). The insulating material is injected into the fourth surface 2000b of the second wafer 2000 by the surface treatment process. At this time, a concentration of the insulating material in the second wafer 2000 decreases with an increasing distance from the fourth surface 2000b of the second wafer 2000. An upper portion of the second wafer 2000 may be oxidized or nitrified by the surface treatment process, and thus the second bonding layer 305 is formed.

Figure 12:
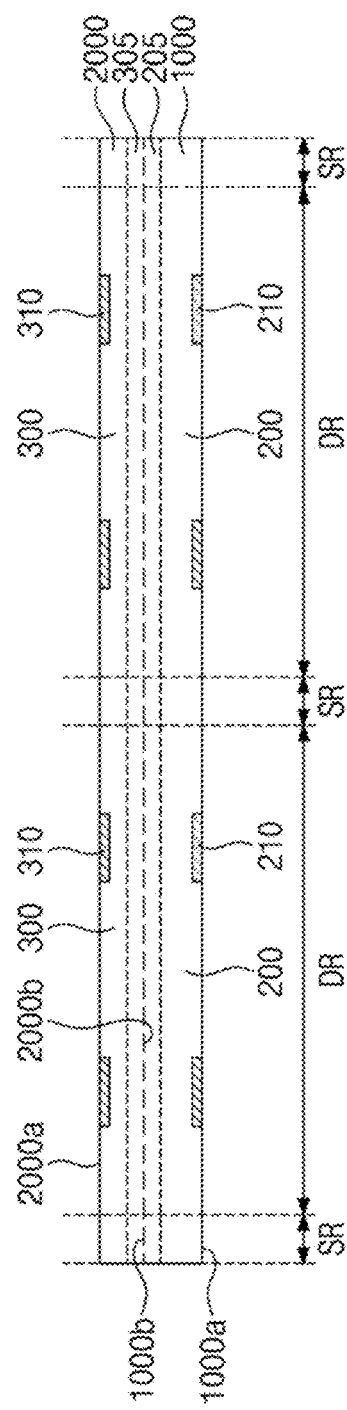

Referring to FIG. 12, according to an embodiment, the second wafer 2000 is bonded onto the first wafer 1000 in detail, the second wafer 2000 is aligned on the first wafer 1000 so that the device regions DR of the first wafer 1000 vertically overlap the device regions DR of the second wafer 2000. Thus, the second semiconductor chips 300 are located on the first semiconductor chips 200. The second wafer 2000 is located on the first wafer 1000 so that the fourth surface 2000b of the second wafer 2000 faces the second surface 1000b of the first wafer 1000. In other words, the first bonding, layer 205 of the first wafer 1000 faces the second bonding layer 305 of the second wafer 2000.

According to an embodiment, the second wafer 2000 is in contact with the first wafer 1000. The first bonding layer 205 of the first wafer 1000 is in contact with the second bonding layer 305 of the second wafer 2000. The bonding of the first wafer 1000 and the second wafer 2000 is a wafer-to-wafer bonding. The first bonding layer 205 of the first wafer 1000 is bonded to the second bonding layer 305 of the second wafer 2000. For example, the second bonding layer 305 and the first bonding layer 205 are bonded to each other to form one body. The bonding of the first bonding layer 205 and the second bonding layer 305 is naturally performed. In detail, the first and second bonding layers 205 and 305 are formed of the same material, such as silicon oxide ($SiO_x$) or silicon nitride (SiN), and the first and second bonding layers 205 and 305 are bonded to each other by a hybrid bonding process performed by surface activation at an interface between the first and second bonding layers 205 and 305 in contact with each other. Since the first and second bonding layers 205 and 305 are bonded to each other, an interface between the first and second wafers 1000 and 2000 may disappear.

In some embodiments, to easily bond the first and second bonding layers 205 and 305, a surface activation process is performed on surfaces of the first and second bonding layers 205 and 305. The surface activation process includes a plasma process. In addition, pressure and heat are applied to the second wafer 2000 to easily bond the first and second bonding layers 205 and 305. The applied pressure is less than, for example, about 30 MPa. The applied treat is provided by an annealing process performed at a temperature of about 100 degrees Celsius to about 500 degrees Celsius. In certain embodiments, different combinations of pressure and temperature may be used in the hybrid bonding process.

According to an embodiment, the first wafer 1000 and the second wafer 2000 are bonded to each other to constitute one body, and thus the first and second wafers 1000 and 2000 are firmly bonded to each other and a semiconductor package with improved structural stability is manufactured.

Figure 13:
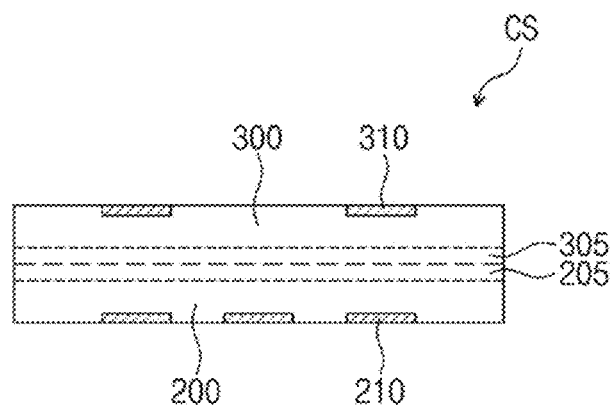

Referring to FIG. 13, According to an embodiment, a cutting process, such as a sawing process, is performed along the scribe regions SR of the first and second wafers 1000 and 2000 to form a chip stack structure CS. The second wafer 2000 and the first wafer 1000 are sequentially cut. Thus, a plurality of chip stack structures CS in which one second semiconductor chip 300 is bonded onto one first semiconductor chip 200 are formed. According to embodiments of the inventive concepts, the first wafer 1000 and the second wafer 2000 are sawed to separate the first semiconductor chips 200 and the second semiconductor chips 300 at the same time, and thus processes of manufacturing the semiconductor package are simplified.

Figure 14:
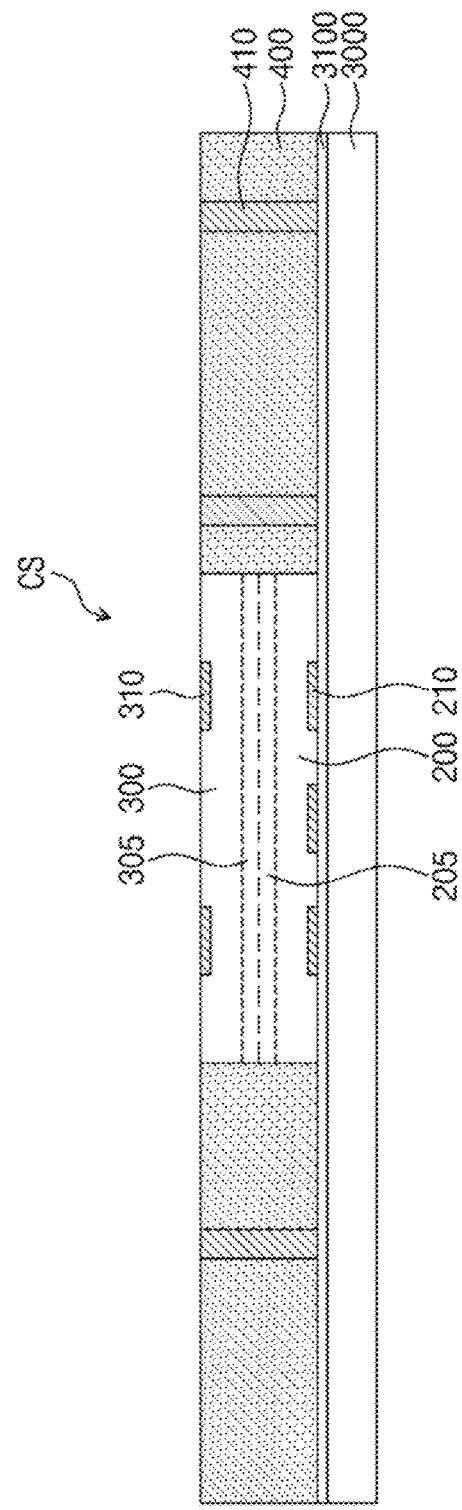

Referring to FIG. 14, according to an embodiment, a first carrier substrate 3000 is provided. A first separation layer 3100 is disposed on the first carrier substrate 3000. The first separation layer 3100 is a double-sided adhesive tape or an adhesive layer. When the first separation layer 3100 is a double-sided adhesive tape, the first separation layer 3100 is adhered onto the first carrier substrate 3000 by a lamination process using a vacuum. When the first separation layer 3100 is an adhesive layer, the first separation layer 3100 is formed by coating an adhesive material on the first carrier substrate 3000.

According to an embodiment, the chip stack structure CS is disposed on the first carrier substrate 3000. The chip stack structure CS is disposed so that an active surface of the first semiconductor chip 200 faces the first carrier substrate 3000. In other words, the chip stack structure CS is provided so that the first chip pads 210 are in contact with the first separation layer 3100 of the first carrier substrate 3000.

According to an embodiment, an insulating layer 400 is formed on the first carrier substrate 3000. The insulating layer 400 is formed by coating an insulating material on the first carrier substrate 3000. The insulating material is coated to cover the chip stack structure CS on the first carrier substrate 3000. The insulating layer 400 covers sidewalls of the chip stack structure CS and exposes a top surface of the chip stack structure CS, i.e., an active surface of the second semiconductor chip 300. The insulating material includes an insulating polymer such as an epoxy molding compound (EMC).

According to an embodiment, connection terminals 410 are formed in the insulating layer 400. For example, via holes can be formed that vertically penetrate the insulating layer 400, and then, the connection terminals 410 are formed by filling the via holes with a conductive material. Each of the connection terminals 410 is a through-electrode that vertically penetrates the insulating layer 400.

Figure 15:
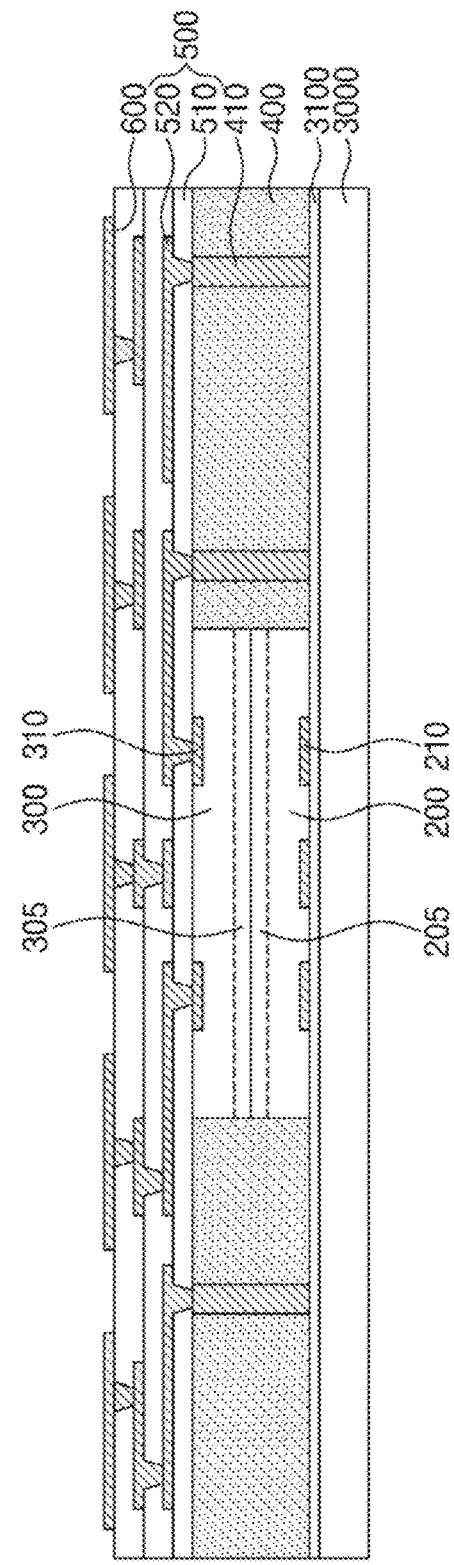

Referring to FIG. 15, according to an embodiment, a second substrate 500 is formed on the second semiconductor chip 300 and the insulating layer 400. Second insulating patterns 510 and second conductive patterns 520 are formed on a top surface of the second semiconductor chip 300 and a top surface of the insulating layer 400, thereby manufacturing the second substrate 500. For example, an insulating layer, such as a silicon oxide layer, is formed on the top surface of the second semiconductor chip 300 and the top surface of the insulating layer 400, and then the insulating layer is patterned to form the second insulating patterns 510. The second chip pads 310 and the connection terminals 410 are exposed by the second insulating patterns 510. A conductive layer is formed on a top surface of the second insulating pattern 510, and then, the conductive layer is patterned to form the second conductive patterns 520. The second conductive patterns 520 are electrically connected to the second chip pads 310 of the second semiconductor chip 300 and the connection terminals 410. Thereafter, a process of forming the second insulating patterns 510 and a process of forming the second conductive patterns 520 can be repeatedly performed to form the second substrate 500.

According to an embodiment, an antenna pattern 600 is formed on a top surface of the second substrate 500. For example, a conductive layer is formed on the top surface of the second substrate 500, and then, the conductive layer is patterned to form the antenna pattern 600. The antenna pattern 600 is electrically connected to the second conductive patterns 520 of the second substrate 500.

Figure 16:
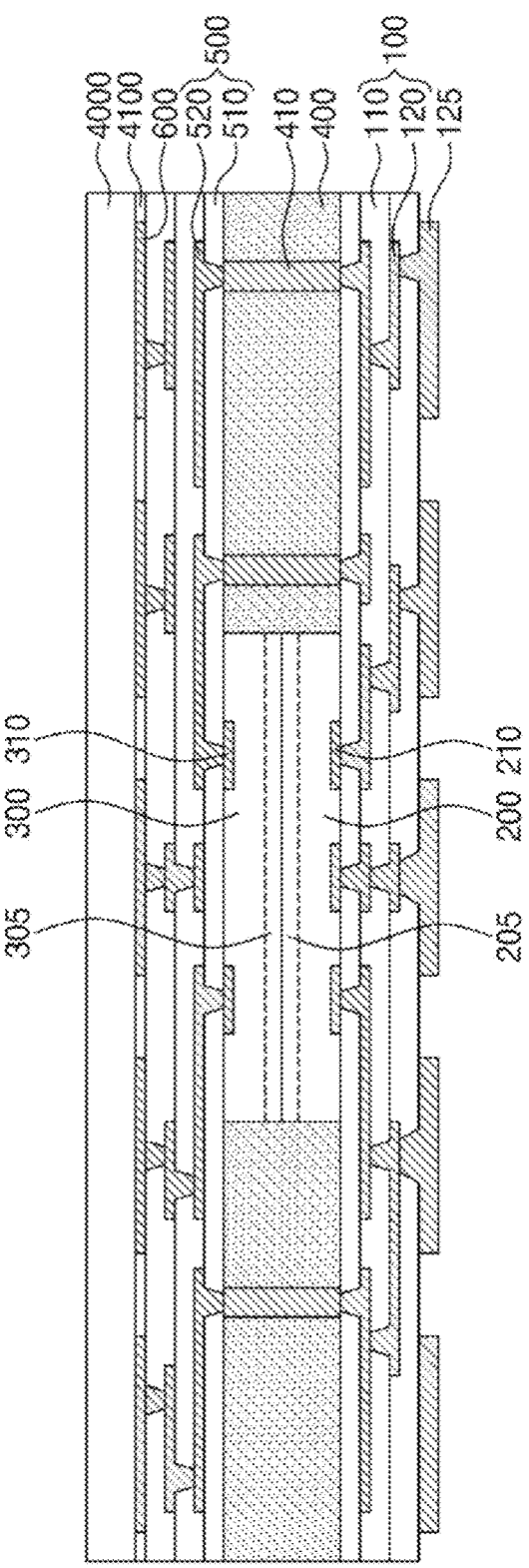

Referring to FIG. 16, according to an embodiment, a second carrier substrate 4000 is attached to the second substrate 500. For example, the second carrier substrate 4000 is an insulating substrate such as a glass substrate. For example, the second carrier substrate 4000 is adhered on the second substrate 500 by using a second separation layer 4100.

Thereafter, according to an embodiment, the first carrier substrate 3000 is removed from the first semiconductor chip 200 and the insulating layer 400. A bottom surface of the first semiconductor chip 200 and a bottom surface of the insulating layer 400 are exposed by the removal of the first carrier substrate 3000. At this time, the first chip pads 210 of the first semiconductor chip 200 and the connection terminals 410 are exposed. The first carrier substrate 3000 can be removed by applying a shear stress or by chemically treating the first separation layer 3100.

According to an embodiment, a first substrate 100 is formed under the first semiconductor chip 200 and the insulating layer 400. First insulating patterns 110 and first conductive patterns 120 are formed on the bottom surface of the first semiconductor chip 200 and the bottom surface of the insulating layer 400, thereby manufacturing the first substrate 100. For example, an insulating layer, such as a silicon oxide layer, is formed on the bottom surface of the first semiconductor chip 200 and the bottom surface of the insulating layer 400, and then, the insulating layer is patterned to form the first insulating patterns 110. The first chip pads 210 and the connection terminals 410 are exposed by the first insulating patterns 110. A conductive layer is formed on a bottom surface of the first insulating patterns 110, and then, the conductive layer is patterned to form the first conductive patterns 120. The first conductive patterns 120 are electrically connected to the first chip pads 210 of the first semiconductor chip 200 and the connection terminals 410. Thereafter, the process of forming, the first insulating patterns 110 and the process of forming the first conductive patterns 120 can be repeatedly performed to form the first substrate 100.

Thereafter, according to an embodiment, the second carrier substrate 4000 is removed from the resultant structure of FIG. 16. The second carrier substrate 4000 may be removed by applying a shear stress or by chemically treating the second separation layer 4100. The semiconductor package described with reference to FIG. 1 is manufactured as described above.

FIGS. 17 to 20 are cross-sectional views that illustrate a method of manufacturing a semiconductor package according to some embodiments of the inventive concepts.

Figure 17:
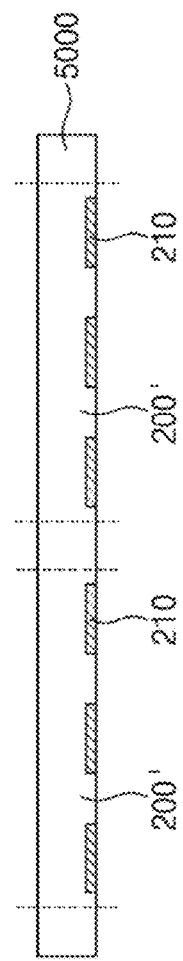
FIG. 17 to 20 are cross-sectional views that illustrate a method of manufacturing a semiconductor package according to some embodiments of the inventive concepts.

Referring to FIG. 17, according to an embodiment, a third wafer 5000 is provided. The third wafer 5000 is a semiconductor wafer. For example, the third wafer 5000 may be a silicon (Si) substrate, a germanium (Ge) substrate, or a silicon-germanium (SiGe) substrate.

According to an embodiment, first semiconductor chips 200' are formed on the third wafer 5000. The first semiconductor chips 200' are formed in one surface of the third wafer 5000. Integrated circuits of the first semiconductor chips 200' are formed at the one surface of the third wafer 5000, and first chip pads 210 of the first semiconductor chips 200' are formed at the one surface of the third wafer 5000.

Figure 18:
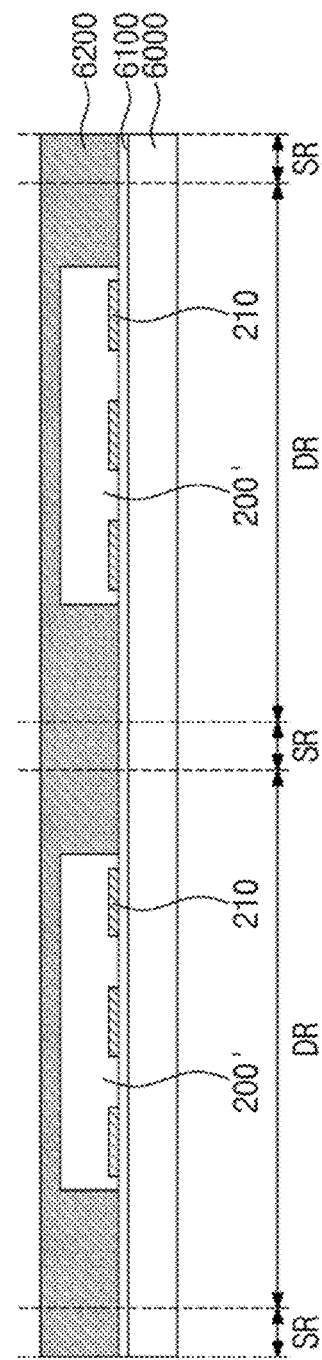

Referring to FIG. 18, according to an embodiment, a cutting process, such as a sawing process, is performed on the third wafer 5000. Thus, the first semiconductor chips 200' can be separated from each other.

According to an embodiment, a third carrier substrate 6000 is provided. The first semiconductor chips 200' are disposed on the third carrier substrate 6000. At this time, the first semiconductor chips 200' are adhered to device regions DR of the third carrier substrate 6000. The first semiconductor chips 200' are adhered to the third carrier substrate 6000 by using a third separation layer 6100. The first semiconductor chips 200' are disposed so that active surfaces of the first semiconductor chips 200' face the third carrier substrate 6000.

According to an embodiment, a molding layer 6200 is formed on the third carrier substrate 6000. The molding layer 6200 is formed by coating an insulating material on the third carrier substrate 6000. The insulating material covers the first semiconductor chips 200' on the third carrier substrate 6000. In other words, the molding layer 6200 covers sidewalk and top surfaces of the first semiconductor chips 200'. The insulating material includes an insulating polymer such as an epoxy molding compound (EMC).

Figure 19:
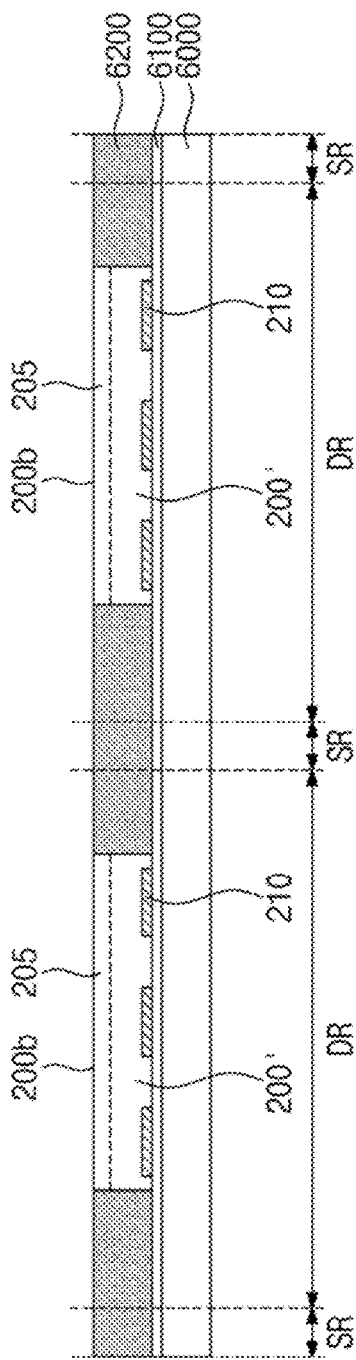

Referring to FIG. 19, according to an embodiment, a planarization process is performed on the molding layer 6200 until top surfaces 200b of the first semiconductor chips 200' are exposed. The planarization process may include an etch-back process or a chemical mechanical polishing (CMP) process. The top surfaces 200b of the first semiconductor chips 200' are exposed by the planarization process, and the top surfaces 200b of the first semiconductor chips 200' are coplanar with a top surface of the molding layer 6200. The exposed top surfaces 200b of the first semiconductor chips 200' are inactive surfaces of the first semiconductor chips 200'.

Next, according to an embodiment, a first bonding layer 205 is formed in each of the first semiconductor chips 200'. In detail, a surface treatment process is performed on the third carrier substrate 6000. An insulating material is injected into the exposed top surfaces 200b of the first semiconductor chips 200' by the surface treatment process. The insulating material may include oxygen (O) or nitrogen (N). In other words, the surface treatment process may be an oxidation process or a nitrification process. At this time, a concentration of the insulating material in each of the first semiconductor chips 200' decreases with increasing distance from the top surface 200b of each of the first semiconductor chips 200'. Upper portions of the first semiconductor chips 200' are oxidized or nitrified by the surface treatment process, and thus the first bonding layers 205 can be formed.

Figure 20:
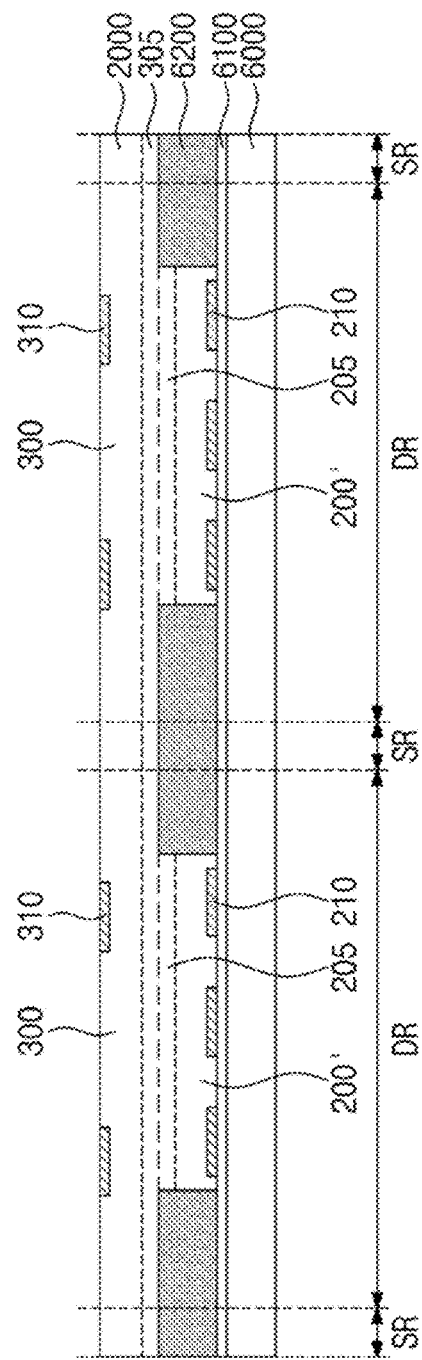

Referring to FIG. 20, according to an embodiment, a second wafer 2000 is bonded onto the first semiconductor chips 200'. The second wafer 2000 is the same as the second wafer 2000 formed using the processes of FIGS. 10 and 11. The second wafer 2000 is disposed on the third carrier substrate 6000. The second wafer 2000 is aligned on the third carrier substrate 6000 so that the device regions DR of the second water 2000 vertically overlap with the device regions DR of the third carrier substrate 6000. Thus, the second semiconductor chips 300 are located on the first semiconductor chips 200'. The first bonding layers 205 of the first semiconductor chips 200' face the second bonding layer 305 of the second wafer 2000.

According to an embodiment, the second wafer 2000 is in contact with the first semiconductor chips 200'. In detail, the second bonding layer 305 of the second wafer 2000 is in contact with the first bonding layers 205 of the first semiconductor chips 200' and the molding layer 6200. The bonding of the first semiconductor chips 200' and the second wafer 2000 is a wafer-to-wafer bonding. The first bonding layers 205 of the first semiconductor chips 200' are bonded to the second bonding layer 305 of the second wafer 2000. For example, the first bonding layers 205 and the second bonding layer 305 are bonded to each other to form one body. The first bonding layers 205 and the second bonding layer 305 are formed of the same material, and the first bonding layers 205 and the second bonding layer 305 are bonded to each other by a surface hybrid bonding process performed at interfaces of the first and second bonding layers 205 and 305 when they are in contact with each other.

According to an embodiment, a cutting process, such as a sawing process, is performed along a scribe region SR of the third carrier substrate 6000. The second wafer 2000 and the molding layer 6200 on the scribe region SR of the third carrier substrate 6000 are sequentially cut or sawed. Thus, the second semiconductor chips 300 can be separated from each other, and the molding layer 6200 can be divided into molding structures 700, as shown in FIG. 3.

Thereafter, according to an embodiment, processes described with reference to FIGS. 13 to 16 are performed to manufacture a semiconductor package described with reference to FIG. 3.

Figure 21:
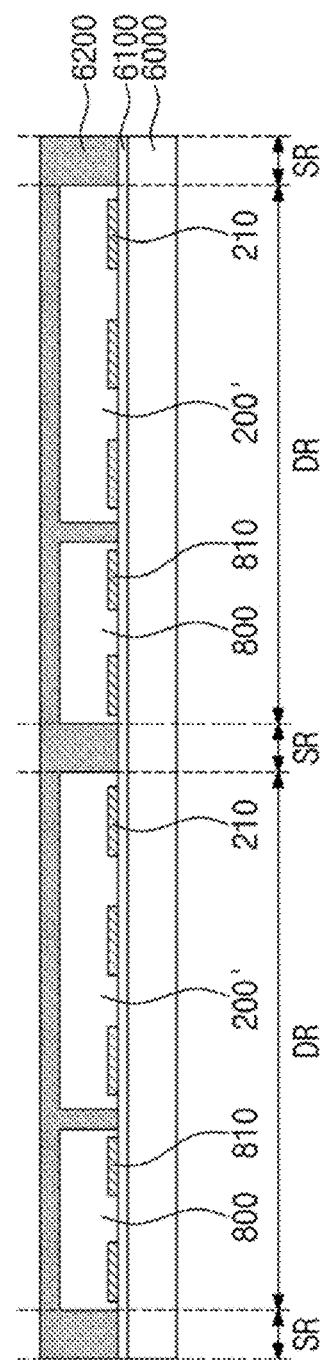
FIGS. 21 and 22 are cross-sectional views that illustrate a method of manufacturing a semiconductor package according to some embodiments of the inventive concepts.
Figure 22:
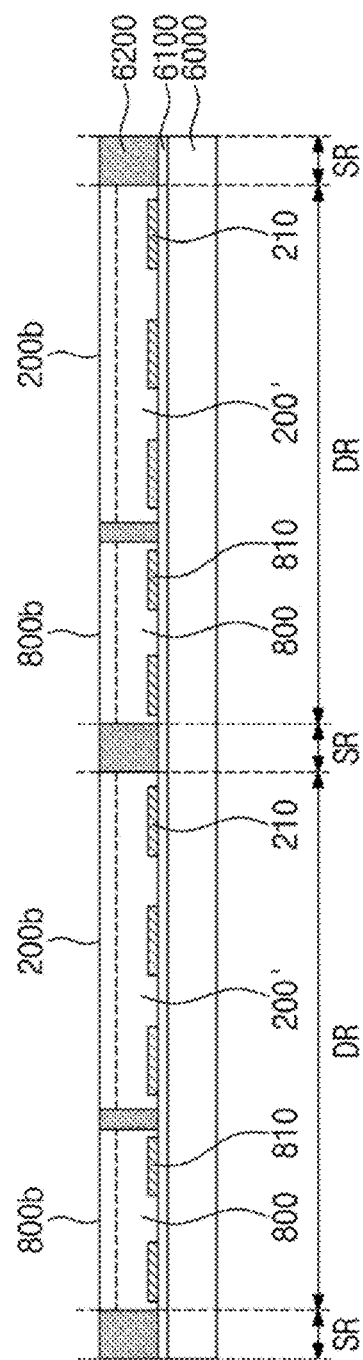

FIGS. 21 and 22 are cross-sectional views that illustrate a method of manufacturing a semiconductor package according to some embodiments of the inventive concepts.

Referring to FIG. 21, according to an embodiment, a third carrier substrate 6000 is provided. First semiconductor chips 200' and third semiconductor chips 800 are disposed on the third carrier substrate 6000. At this tune, each of the first semiconductor chips 200' and each of the third semiconductor chips 800 are adhered onto each of the device regions DR of the third carrier substrate 6000. In other words, one first semiconductor chip 200' and one third semiconductor chip 800 are adhered on one device region DR. The first semiconductor chips 200' and the third semiconductor chips 800 are adhered to the third carrier substrate 6000 by using a third separation layer 6100. The first semiconductor chips 200' and the third semiconductor chips 800 are disposed so that active surfaces thereof face the third carrier substrate 6000.

According to an embodiment, a molding layer 6200 is formed on the third carrier substrate 6000. The molding layer 6200 is formed by coating an insulating material on the third carrier substrate 6000. The insulating material covers the first semiconductor chips 200' and the third semiconductor chips 800 on the third carrier substrate 6000.

Referring to FIG. 22, according to an embodiment, a planarization process is performed on the molding laser 6200 until top surfaces 200b of the first semiconductor chips 200' and top surfaces 800b of the third semiconductor chips 800 are exposed. The planarization process may include an etch-back process or a chemical mechanical polishing (CMP) process. The top surfaces 200b of the first semiconductor chips 200' and the top surfaces 800b of the third semiconductor chips 800 are exposed by the planarization process. The exposed top surfaces 200b of the first semiconductor chips 200' and the exposed top surfaces 800b of the third semiconductor chips 800 are inactive surfaces.

Thereafter, according to an embodiment, a surface treatment process is performed on the third carrier substrate 6000. An insulating material is injected into the exposed top surfaces 200b of the first semiconductor chips 200' and the exposed top surfaces 800b of the third semiconductor chips 800 by the surface treatment process. The insulating material may include oxygen (O) ore nitrogen (N). In other words, the surface treatment process may be an oxidation process or a nitrification process.

Next, according to an embodiment, a second wafer is bonded onto the first semiconductor chips 200' and the third semiconductor chips 800. The second wafer is the same as the second wafer 2000 formed using the processes of FIGS. 10 and 11. The second wafer 2000 is disposed on the third carrier substrate 6000. The second wafer 2000 is aligned on the third carrier substrate 6000 so that the device regions DR of the second wafer 2000 vertically overlap with the device regions DR of the third carrier substrate 6000. The second wafer 2000 is in contact with the first semiconductor chips 200' and the third semiconductor chips 800. The bonding of the first semiconductor chips 200' and the second wafer 2000 and the bonding of the third semiconductor chips 800 and the second wafer 2000 is a wafer-to-wafer bonding.

According to an embodiment, a cutting, process, such as a sawing process, is performed along a scribe region SR of the third carrier substrate 6000. The second wafer 2000 and the molding layer 6200 on the scribe region SR of the third carrier substrate 6000 are sequentially cut or sawed. Thus, the second semiconductor chips 300 can be separated from each other, and the molding, layer 6200 can be divided into molding structures 700 shown in FIG. 4.

Thereafter, according to an embodiment, processes described with reference to FIGS. 13 to 16 are performed to manufacture a semiconductor package described with reference to FIG. 4.

FIGS. 23 to 26 are cross-sectional views that illustrate a method of manufacturing a semiconductor package according to some embodiments of the inventive concepts.

Figure 23:
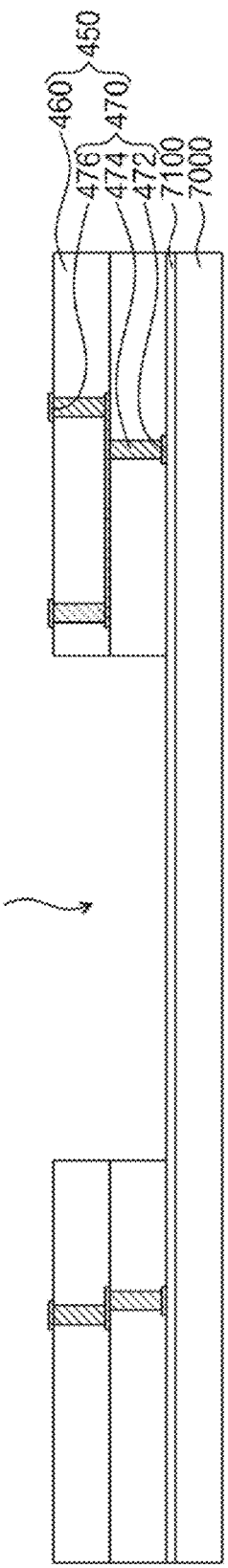
FIGS. 23 to 26 are cross-sectional views that illustrate a method of manufacturing a semiconductor package according to some embodiments of the inventive concepts.

Referring to FIG. 23, according to an embodiment, a connection substrate 450 is provided. The connection substrate 450 includes a base layer 460 and a conductive portion 470 that corresponds to an interconnection pattern in the base layer 460. The conductive portion 470 includes lower pads 472, vias 474, and upper pads 476.

According to an embodiment, an opening 452 is formed in the connection substrate 450. The opening 452 is formed by removing a portion of the connection substrate 450 and thus penetrates the connection substrate 450. For example, the process that forms the opening 452 may be an etching process such as a drilling process, a laser ablation process, or a laser cutting process. The opening. 452 is a space in which a chip stack structure CS, such as that shown in FIG. 13, will be provided in a subsequent process.

According to an embodiment, the connection substrate 450 is adhered onto a fourth carrier substrate 7000. For example, the fourth carrier substrate 7000 may be an insulating substrate that includes a glass or a polymer, or may be a conductive substrate that includes a metal.

For example, according to an embodiment, the fourth carrier substrate 7000 is adhered to a bottom surface of the connection substrate 450 by an adhesive member 7100 provided on a top surface of the fourth carrier substrate 7000. For example, the adhesive member 7100 includes an adhesive tape.

Figure 24:
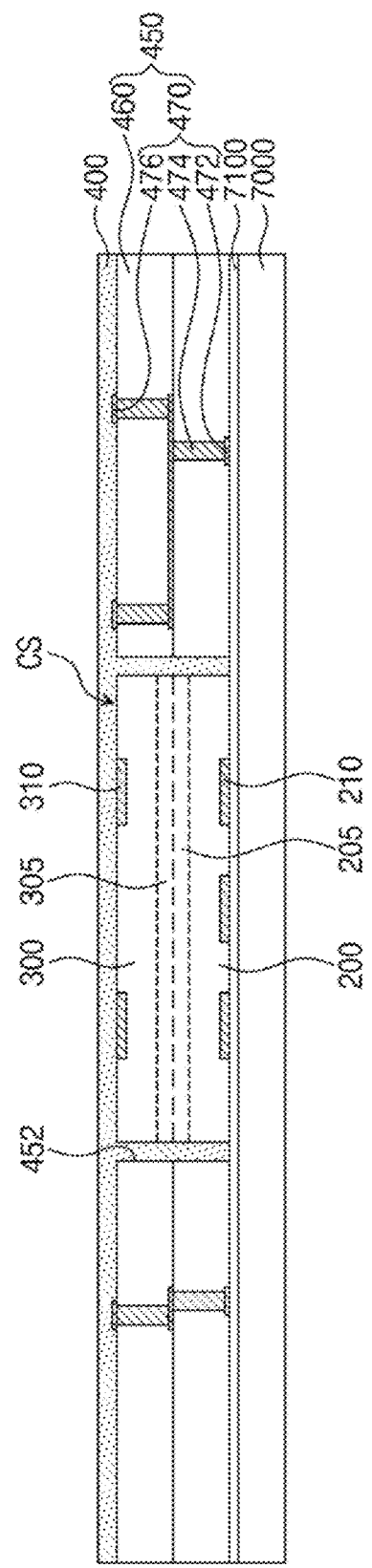

Referring to FIG. 24, according to an embodiment, the chip stack structure CS is disposed on the fourth carrier substrate 7000. The chip stack structure CS is disposed in the opening 452 of the connection substrate 450. The chip stack structure CS is disposed so that the active surface of the first semiconductor chip 200 faces the fourth carrier substrate 7000. The chip stack structure CS includes the first semiconductor chip 200, the first chip pads 210, the first bonding layer 205, the second semiconductor chip 300, the second chip pads 340 and second bonding layer 305 described with respect to FIGS. 1 and 7, above.

According to an embodiment, an insulating layer 400 is formed on the fourth carrier substrate 7000. The insulating layer 400 is formed by coating an insulating material on the connection substrate 450. The insulating material fills a space between the connection substrate 450 and the chip stack structure CS. In addition, the insulating material covers a top surface of the connection substrate 450 and a top surface of the chip stack structure CS. The insulating material includes an insulating polymer such as an epoxy molding compound (EMC).

Figure 25:
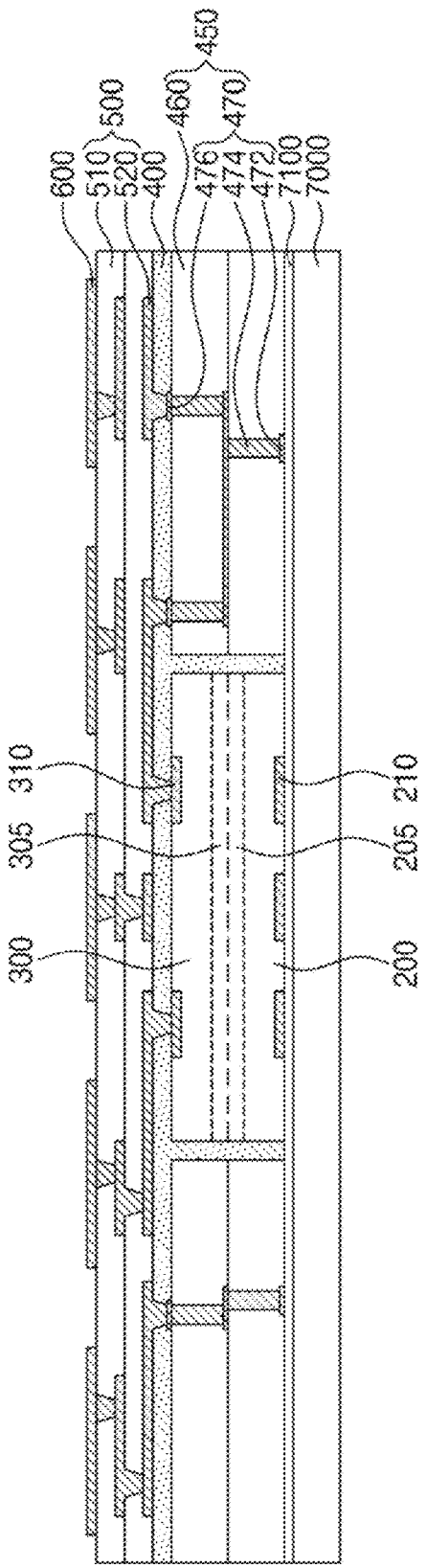

Referring to FIG. 25, according to an embodiment, a second substrate 500 is formed on the insulating layer 400. Second insulating patterns 510 and second conductive patterns 520 are formed on a top surface of the second semiconductor chip 300 and a top surface of the insulating layer 400, thereby manufacturing the second substrate 500. In detail, the insulating layer 400 is patterned to expose the upper pads 476 of the connection substrate 450 and the second chip pads 310 of the second semiconductor chip 300. A conductive layer is formed on the top surface of the insulating layer 400, and then, the conductive layer is patterned to form the second conductive patterns 520. The second conductive patterns 520 are electrically connected to the second chip pads 310 of the second semiconductor chip 300 and the upper pads 476. An insulating layer, such as a silicon oxide layer, is formed on the second conductive patterns 520, and then, the insulating layer is patterned to form the second insulating patterns 510. Thereafter, the process of forming the second insulating patterns 510 and the process of forming the second conductive patterns 520 can be repeatedly performed to form the second substrate 500.

According to an embodiment, an antenna pattern 600 is formed on a top surface of the second substrate 500. For example, a conductive layer is formed on the top surface of the second substrate 500, and then, the conductive layer is patterned to form the antenna pattern 600. The antenna pattern 600 is electrically connected to the second conductive pattern 520 of the second substrate 500.

Figure 26:
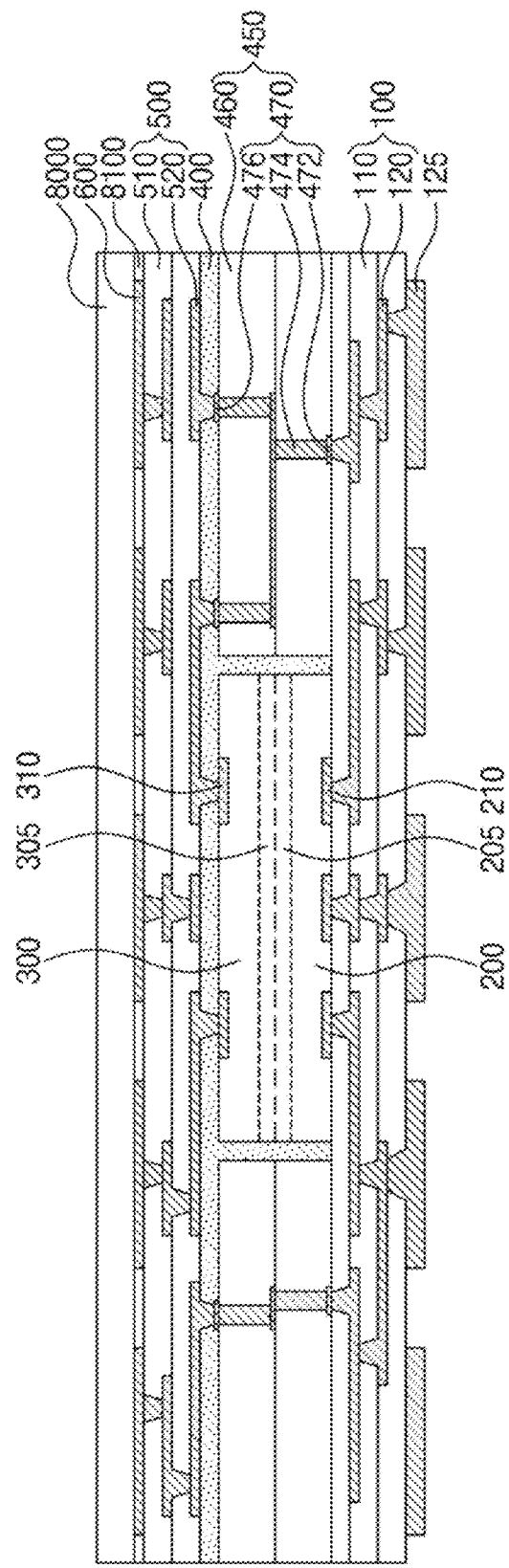

Referring to FIG. 26, according to an embodiment, a fifth carrier substrate 8000 is provided on the second substrate 500. For example, the fifth carrier substrate 8000 is an insulating substrate such as a glass substrate. For example, the fifth carrier substrate 8000 is adhered on the second substrate 500 by using a fifth separation layer 8100.

Thereafter, according to an embodiment, the fourth carrier substrate 7000 is removed from the first semiconductor chip 200 and the connection substrate 450. A bottom surface of the first semiconductor chip 200 and a bottom surface of the connection substrate 450 are exposed by the removal of the fourth carrier substrate 7000. At this time, the first chip pads 210 of the first semiconductor chip 200 and the lower pads 472 of the connection substrate 450 are exposed. The fourth carrier substrate 7000 may be removed by applying a shear stress or by chemically treating the fourth separation layer 7100.

According to an embodiment, a first substrate 100 is formed under the first semiconductor chip 200 and the connection substrate 450. First insulating patterns 110 and first conductive patterns 120 are formed on the bottom surface of the first semiconductor chip 200 and the bottom surface of the connection substrate 450, thereby manufacturing the first substrate 100. For example, an insulating layer, such as a silicon oxide layer, is formed on the bottom surface of the first semiconductor chip 200 and the bottom surface of the connection substrate 450, and then, the insulating layer is patterned to form the first insulating patterns 110. The first chip pads 210 and the tower pads 472 are exposed by the first insulating pattern 110. A conductive layer is formed on a bottom surface of the first insulating patterns 110, and then, the conductive layer is patterned to form the first conductive patterns 120. The first conductive patters 120 are electrically connected to the first chip pads 210 of the first semiconductor chip 200 and the lower pads 472 of the connection substrate 450. Thereafter, the process of forming the first insulating patterns 110 and the process of forming the first conductive patterns 120 are repeatedly performed to form the first substrate 100.

Thereafter, according to an embodiment, the fifth carrier substrate 8000 is removed from the resultant structure of FIG. 26. The fifth carrier substrate 8000 may be removed by applying a shear stress or by chemically treating the fifth separation layer 8100. A semiconductor package described with reference to FIG. 7 can be manufactured as described above.

In a semiconductor package according to embodiments of the inventive concepts, a portion of the first semiconductor chip and a portion of the second semiconductor chip constitute one body. Thus, the first and second semiconductor chips can be firmly bonded to each other, and the structural stability of the semiconductor package can be improved. In addition, the first and second semiconductor chips can be bonded to each other by using a bonding layer formed of silicon oxide or silicon nitride, which are highly thermally conductive, and thus heat generated from the first semiconductor chip can be easily released or dissipated through the second semiconductor chip.

Furthermore, the first and second semiconductor chips can be bonded to each other without an additional bonding member between the first and second semiconductor chips, and thus a height of the semiconductor package can be reduced and the semiconductor package can be miniaturized.

All of the first and second semiconductor chips that control an antenna pattern can be provided in a single package that has the antenna pattern, and thus a miniaturized semiconductor package with improved electrical characteristics can be provided or realized.

While embodiments of the inventive concepts have been described with reference to exemplary embodiments, it will be apparent to those skilled in the art that various changes and modifications can be made without departing from the spirits and scopes of the inventive concepts. Therefore, it should be understood that the above exemplary embodiments are not limiting, but illustrative. Thus, the scopes of embodiments of the inventive concepts are to be determined by the broadest permissible interpretation of the following claims and their equivalents, and shall not be restricted or limited by the foregoing description.

What is claimed is:

1. A semiconductor package, comprising:
a first redistribution substrate;
a first semiconductor chip mounted on the first redistribution substrate;
a second semiconductor chip disposed on a top surface of the first semiconductor chip,
wherein an upper portion of the first semiconductor chip and a lower portion of the second semiconductor chip contain an insulating material, the insulating material includes oxygen or nitrogen, the upper portion of the first semiconductor chip includes an oxide, a nitride or an oxynitride of a semiconductor material of the first semiconductor chip, the lower portion of the second semiconductor chip includes an oxide, a nitride or an oxynitride of a semiconductor material of the second semiconductor chip, and a concentration of oxygen or nitrogen in the upper portion of the first semiconductor chip and a concentration of oxygen or nitrogen in the lower portion of the second semiconductor chip decreases with increasing distance from an interface of the first and second semiconductor chips;
an insulating layer surrounding the first and second semiconductor chips on the first redistribution substrate;
a second redistribution substrate disposed on the second semiconductor chip and on which the second semiconductor chip is mounted; and a connection terminal disposed at a side of the first and second semiconductor chips and connected to the first and second redistribution substrates,
wherein an inactive surface of the second semiconductor chip is in contact with an inactive surface of the first semiconductor chip, and
wherein, at the interface of the first and second semiconductor chips, an upper portion of the first semiconductor chip and a lower portion of the second semiconductor chip constitute one body formed of a same material.

2. The semiconductor package of claim 1, wherein the first semiconductor chip includes first chip pads of that are connected to an integrated circuit in the first semiconductor chip and to the first redistribution substrate, and
wherein the second semiconductor chip includes second chip pads of that are connected to an integrated circuit in the second semiconductor chip and connected to the second redistribution substrate.

3. The semiconductor package of claim 1, wherein a width of the first semiconductor chip is equal to a width of the second semiconductor chip, and
wherein sidewalls of the first semiconductor chip are vertically aligned with sidewalls of the second semiconductor chip.

4. The semiconductor package of claim 1, wherein a width of the first semiconductor chip is less than a width of the second semiconductor chip, and
wherein the semiconductor package further comprises a molding structure disposed at a side of the first semiconductor chip and between the second semiconductor chip and the first redistribution substrate.

5. The semiconductor package of claim 4, further comprising:
a third semiconductor chip that is spaced apart from the first semiconductor chip and disposed on the inactive surface of the second semiconductor chip,
wherein an inactive surface of the third semiconductor chip is in contact with the inactive surface of the second semiconductor chip, and
wherein, at an interface of the second and third semiconductor chips, an upper portion of the third semiconductor chip and the lower portion of the second semiconductor chip constitute one body formed of the same material.

6. The semiconductor package of claim 5, wherein the molding structure fills a space between the first semiconductor chip and the third semiconductor chip.

7. The semiconductor package of claim 1, further comprising:
a fourth semiconductor chip horizontally spaced apart from the first and second semiconductor chips and mounted on the first redistribution substrate,
wherein the insulating layer surrounds the fourth semiconductor chip.

8. The semiconductor package of claim 1, further comprising:
wherein the insulating layer fills a space between the first redistribution substrate and the second redistribution substrate, and
wherein the connection terminal includes a through-electrode that vertically penetrates the insulating layer.

9. The semiconductor package of claim 1, further comprising:
a connection substrate disposed between the first and second redistribution substrates and that includes an opening that penetrates the connection substrate, wherein the first and second semiconductor chips are disposed in the opening of the connection substrate, wherein the insulating layer fills a space between the connection substrate and the first semiconductor chip and between the connection substrate and the second semiconductor chip in the opening, and wherein the connection terminal includes an interconnection pattern disposed in the connection substrate.

10. The semiconductor package of claim 1, further comprising:

an antenna pattern disposed on the second redistribution substrate, wherein the antenna pattern is disposed on a top surface of an insulating pattern of the second redistribution substrate and is connected to an interconnection pattern provided in the insulating pattern.

11. A semiconductor package, comprising:

a first substrate;

a first semiconductor chip mounted on the first substrate;

a second semiconductor chip disposed on a top surface of the first semiconductor chip;

a third semiconductor chip spaced apart from the first semiconductor chip and disposed on a bottom surface of the second semiconductor chip;

an insulating layer that surrounds the first and second semiconductor chips on the first substrate;

a second substrate disposed on the insulating layer and the second semiconductor chip and on which the second semiconductor chip is mounted;

a connection terminal that penetrates the insulating layer at a side of the first and, second semiconductor chips and is connected to the first and second substrates; and an antenna pattern disposed on a top surface of the second substrate and that is electrically connected to the second semiconductor chip, wherein the antenna pattern generates broadside radiation and comprises a plurality of patch patterns, wherein the second semiconductor chip is connected to the antenna pattern through the second substrate, wherein the first semiconductor chip is connected to the antenna pattern through the first substrate, the connection terminal and the second substrate, wherein an inactive surface of the third semiconductor chip faces an inactive surface of the second semiconductor chip, and wherein, at an interface of the second and third semiconductor chips, an upper portion of the third semiconductor chip and a lower portion of the second semiconductor chip constitute one body formed of a same material.

12. The semiconductor package of claim 11, wherein an inactive surface of the second semiconductor chip is in contact with an inactive surface of the first semiconductor chip, and wherein, at an interface of the first and second semiconductor chips, an upper portion of the first semiconductor chip and a lower portion of the second semiconductor chip constitute one body formed of a same material.

13. The semiconductor package of claim 12, wherein the upper portion of the first semiconductor chip includes an oxide, a nitride or an oxynitride of a semiconductor material of the first semiconductor chip, and wherein the lower portion of the second semiconductor chip includes an oxide, a nitride or an oxynitride of a semiconductor material of the second semiconductor chip.

14. The semiconductor package of claim 13, wherein a concentration of oxygen or nitrogen in the upper portion of the first semiconductor chip and the lower portion of the second semiconductor chip decreases with increasing distance from the interface of the first and second semiconductor chips.

15. The semiconductor package of claim 11, wherein a width of the first semiconductor chip is equal to a width of the second semiconductor chip, and wherein sidewalls of the first semiconductor chip are vertically aligned with sidewalls of the second semiconductor chip.

16. A semiconductor package, comprising:

a first substrate;

a first semiconductor chip mounted on a top surface of the first substrate wherein a first active surface of the first semiconductor chip faces the first substrate;

a second substrate disposed on the first semiconductor chip;

a second semiconductor chip mounted on a bottom surface of the second substrate wherein a second active surface of the second semiconductor chip faces the second substrate; and wherein an upper portion of the first semiconductor chip and a lower portion of the second semiconductor chip contain an insulating material, the insulating material includes oxygen or nitrogen, the upper portion of the first semiconductor chip includes an oxide, a nitride or an oxynitride of a semiconductor material of the first semiconductor chip, the lower portion of the second semiconductor chip includes an oxide, a nitride or an oxynitride of a semiconductor material of the second semiconductor chip, and a concentration of oxygen or nitrogen in the upper portion of the first semiconductor chip and a concentration of oxygen or nitrogen in the lower portion of the second semiconductor chip decreases with increasing distance from an interface of the first and second semiconductor chips;

an antenna pattern disposed on a top surface of the second substrate, wherein, at an interface of the first and second semiconductor chips, an upper portion of the first semiconductor chip and a lower portion of the second semiconductor chip constitute one body formed of the same material, wherein the antenna pattern generates broadside radiation and comprises a plurality of patch patterns, and wherein the antenna pattern is disposed on a top surface of an insulating pattern of the second substrate and is connected to an interconnection pattern disposed in the insulating pattern.

* * * * *